(12) United States Patent
Choi

(10) Patent No.: US 11,133,328 B2
(45) Date of Patent: Sep. 28, 2021

(54) SEMICONDUCTOR DEVICE AND MANUFACTURING METHOD THEREOF

(71) Applicant: SK hynix Inc., Gyeonggi-do (KR)

(72) Inventor: Kang Sik Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/453,448

(22) Filed: Jun. 26, 2019

(65) Prior Publication Data

US 2019/0326320 A1 Oct. 24, 2019

Related U.S. Application Data

(63) Continuation of application No. 15/934,477, filed on Mar. 23, 2018, now Pat. No. 10,381,375.

(30) Foreign Application Priority Data

Jul. 17, 2017 (KR) .................. 10-2017-0090337

(51) Int. Cl.
| | |
|---|---|
| *H01L 27/11582* | (2017.01) |
| *H01L 29/423* | (2006.01) |
| *H01L 29/45* | (2006.01) |
| *H01L 23/528* | (2006.01) |
| *H01L 29/10* | (2006.01) |
| *H01L 27/11565* | (2017.01) |
| *H01L 27/11575* | (2017.01) |

(52) U.S. Cl.
CPC ...... *H01L 27/11582* (2013.01); *H01L 23/528* (2013.01); *H01L 27/11565* (2013.01); *H01L 29/1079* (2013.01); *H01L 29/4234* (2013.01); *H01L 29/456* (2013.01); *H01L 27/11575* (2013.01)

(58) Field of Classification Search
CPC ............. H01L 27/11582; H01L 23/528; H01L 29/1079; H01L 29/4264; H01L 29/456
See application file for complete search history.

(56) References Cited

U.S. PATENT DOCUMENTS

| | | | | |
|---|---|---|---|---|
| 2011/0180941 | A1* | 7/2011 | Hwang | H01L 27/11578 257/786 |
| 2014/0329379 | A1* | 11/2014 | Kim | H01L 21/76807 438/586 |
| 2016/0163686 | A1* | 6/2016 | Lee | H01L 27/11565 257/314 |
| 2016/0225754 | A1 | 8/2016 | Jang | |

(Continued)

OTHER PUBLICATIONS

Office Action issued by the United States Patent and Trademark Office for U.S. Appl. No. 16/189,466 dated Sep. 3, 2019.

(Continued)

*Primary Examiner* — Zandra V Smith
*Assistant Examiner* — Andre C Stevenson
(74) *Attorney, Agent, or Firm* — IP & T Group LLP

(57) ABSTRACT

A semiconductor device includes: a stack structure including horizontal conductive patterns and interlayer insulating layers, which are alternately stacked; gate patterns overlapping with both ends of the stack structure under the stack structure, the gate patterns being spaced apart from each other; and a channel pattern including vertical parts penetrating the stack structure, and a connection part disposed under the stack structure, the connection part connecting the vertical parts.

20 Claims, 30 Drawing Sheets

(56) References Cited

U.S. PATENT DOCUMENTS

2017/0221756 A1    8/2017  Tsutsumi et al.
2018/0108672 A1*   4/2018  Choi ................ H01L 27/11565
2020/0176467 A1    6/2020  Choi et al.

OTHER PUBLICATIONS

Notice of Allowance issued by the USPTO for U.S. Appl. No. 16/189,563 dated Jul. 30, 2020.

* cited by examiner

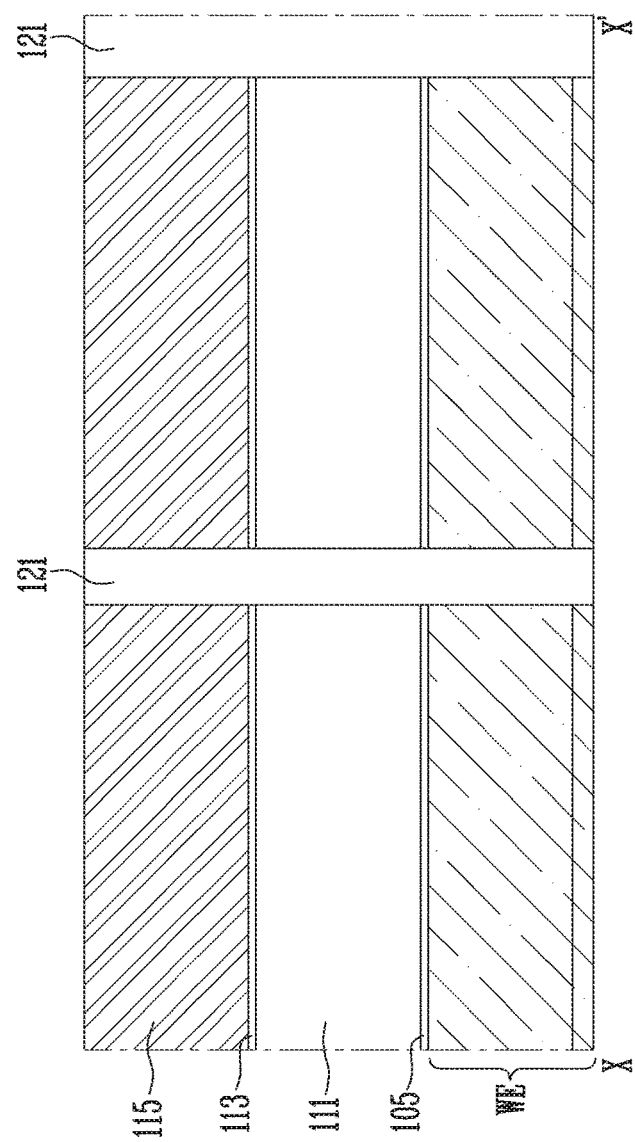
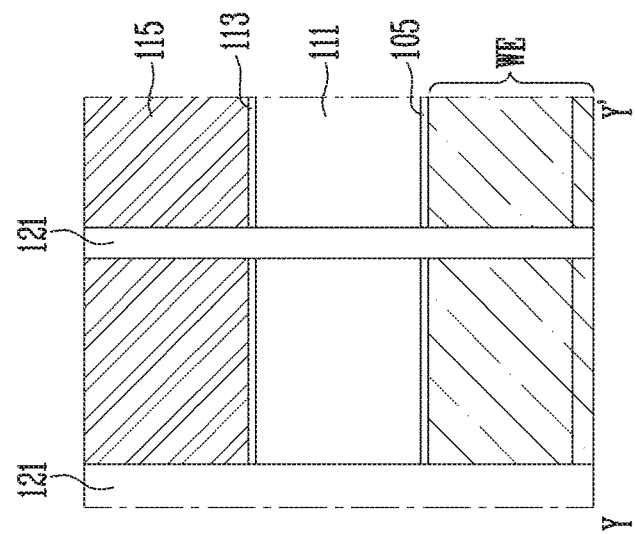
FIG. 6B

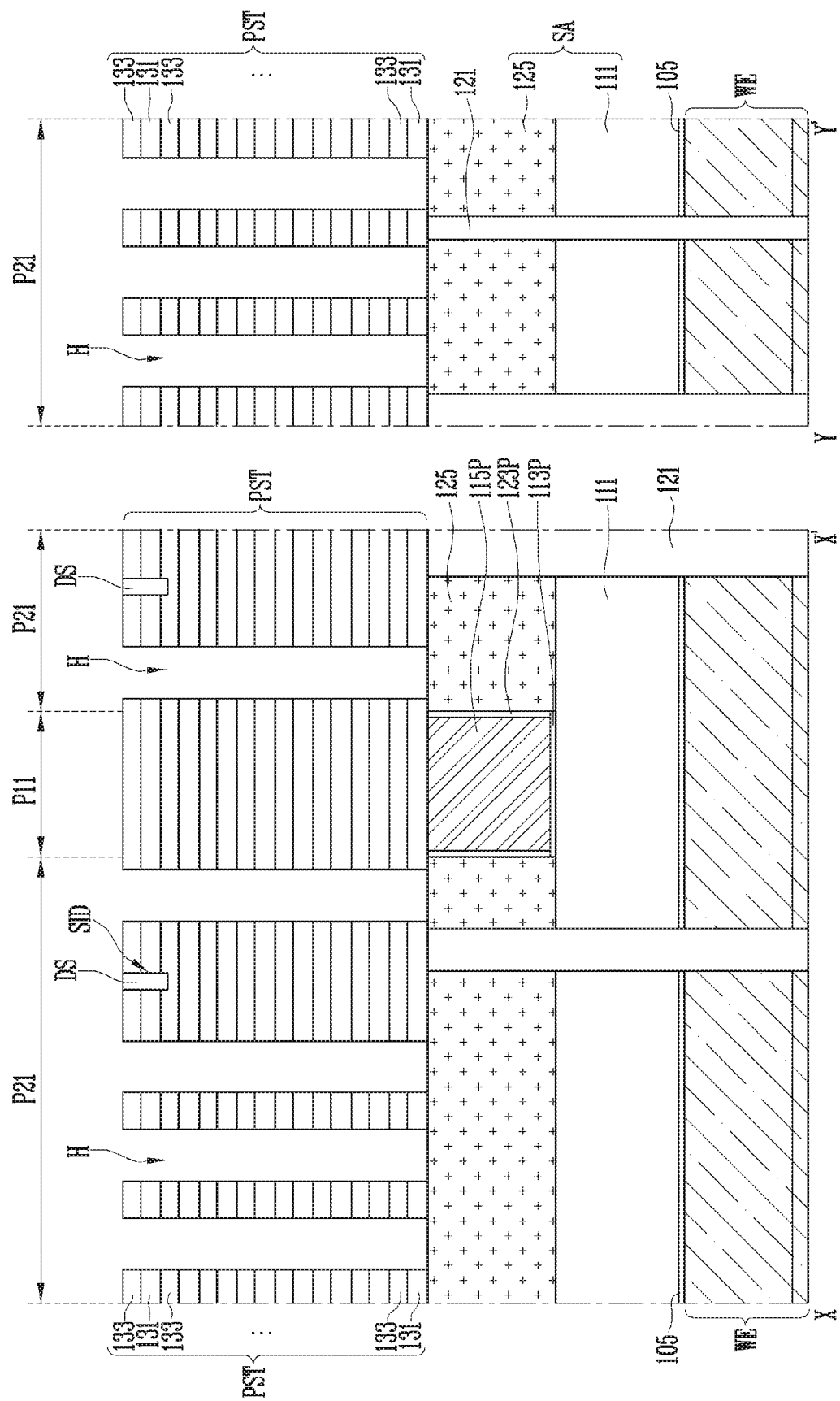

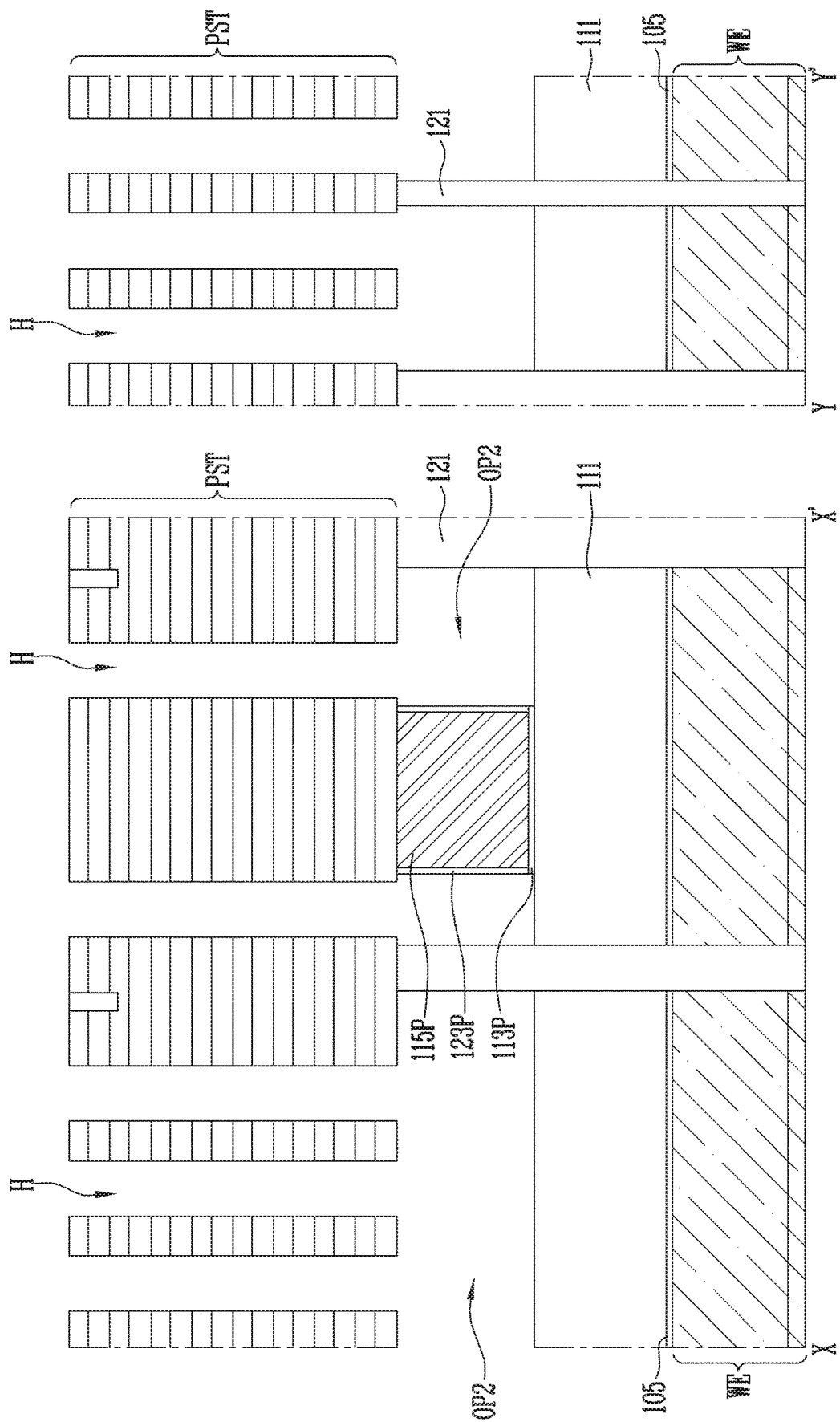

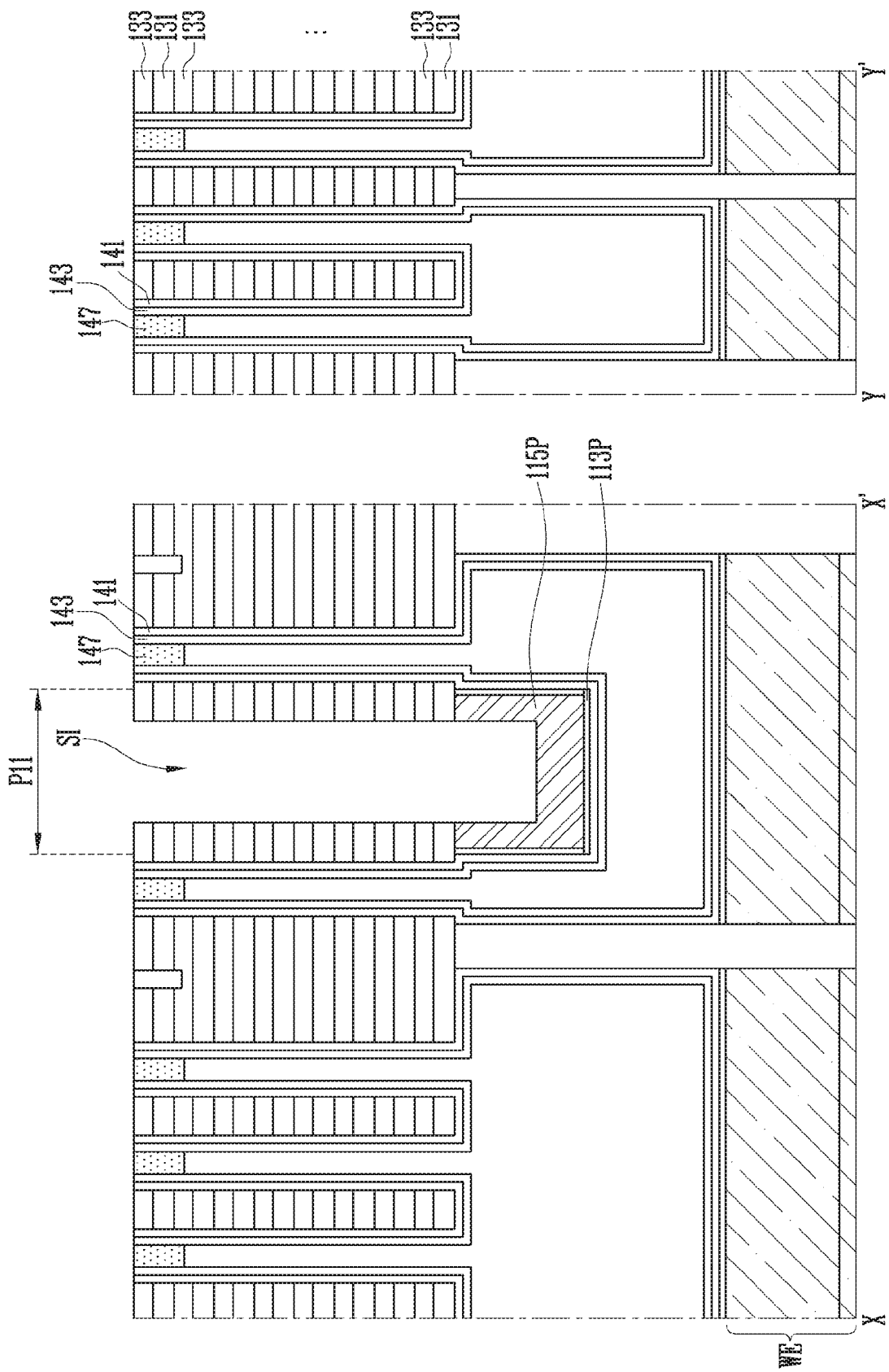

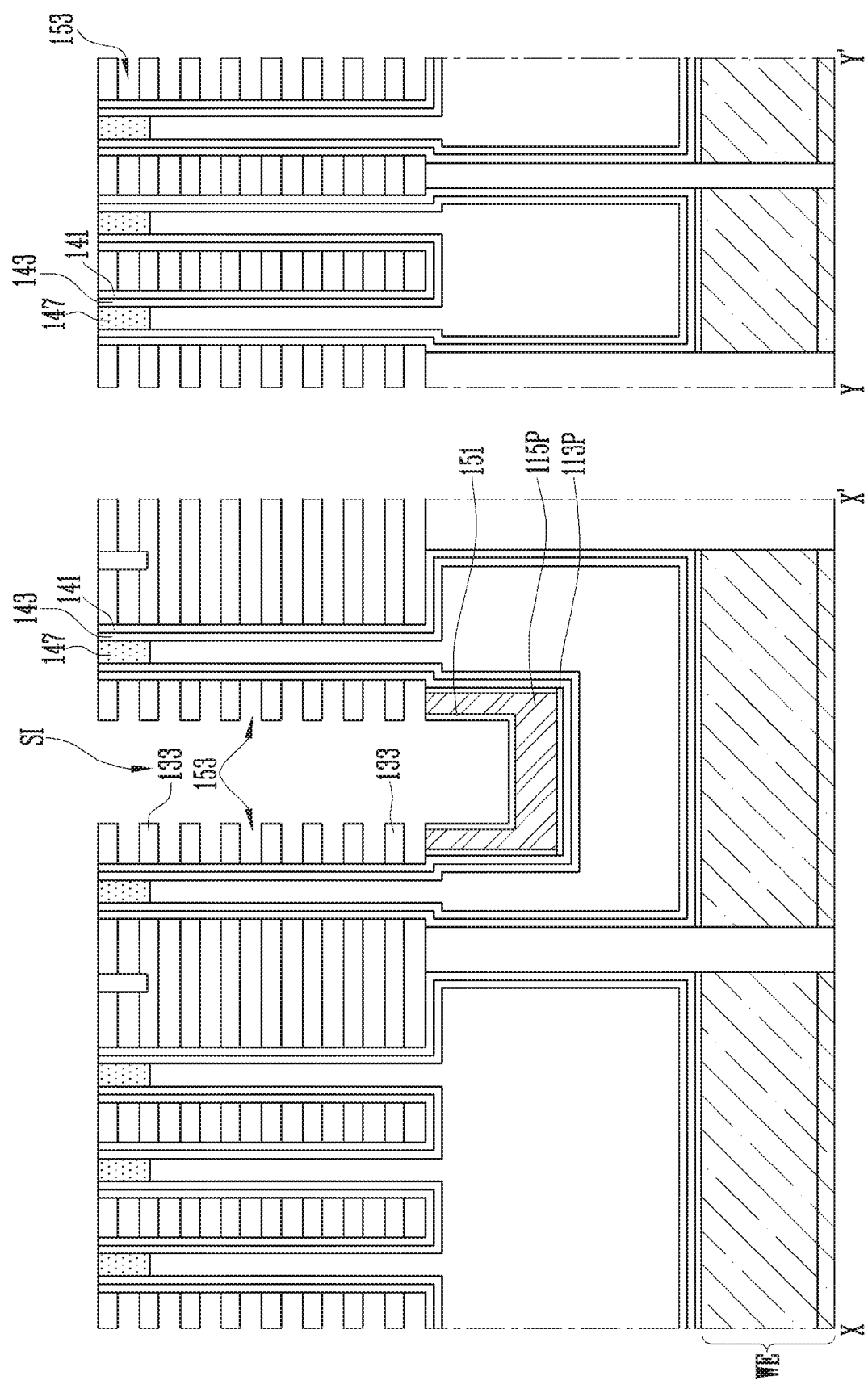

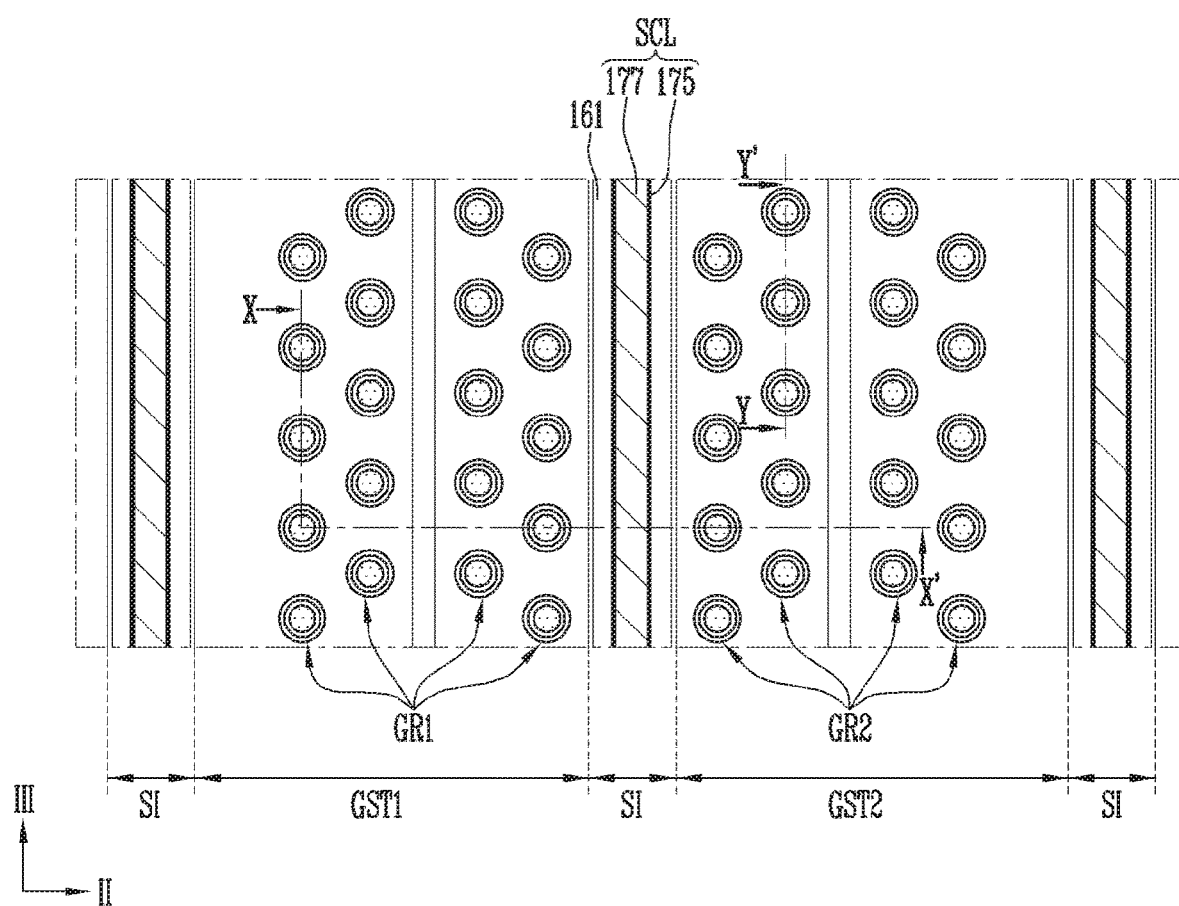

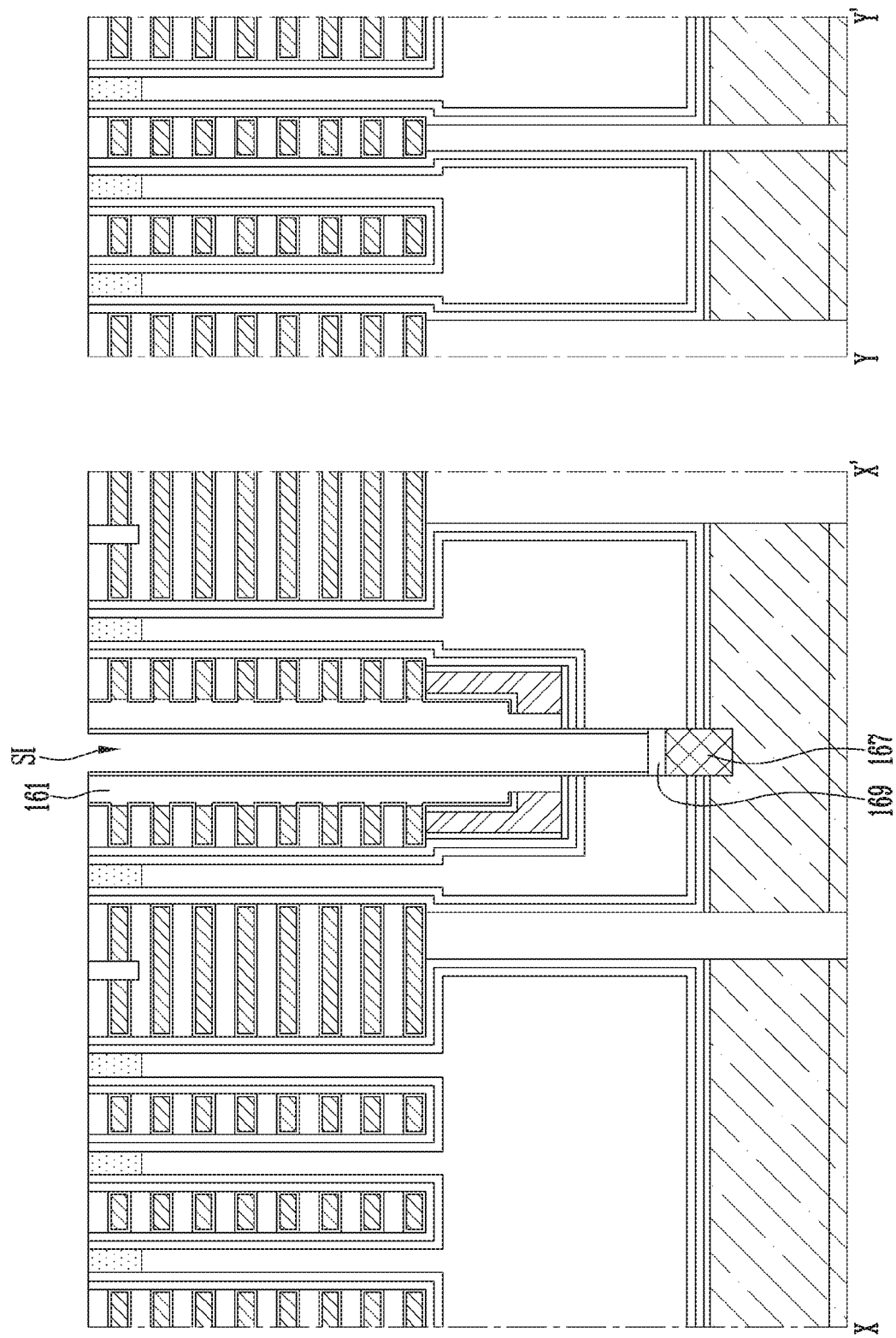

SEMICONDUCTOR DEVICE AND MANUFACTURING METHOD THEREOF

CROSS-REFERENCE TO RELATED APPLICATION

This application is a continuation of U.S. patent application Ser. No. 15/934,477 filed on Mar. 23, 2018 which claims benefits of priority of Korean Patent Application No. 10-2017-0090337 filed on Jul. 17, 2017. The disclosure of each of the foregoing application is incorporated herein by reference in its entirety.

BACKGROUND

Field of Invention

An aspect of the present disclosure relates to a semiconductor device and a manufacturing method thereof, and more particularly, to a three-dimensional semiconductor device and a manufacturing method thereof.

Description of Related Art

A semiconductor device includes a plurality of memory cell transistors capable of storing data. The memory cell transistors may be connected in series between select transistors to constitute a memory string. A three-dimensional semiconductor device has been proposed in order to achieve a high degree of integration of semiconductor devices. Gate patterns of memory cell transistors and select transistors may be stacked on each other to form a three-dimensional semiconductor device. In implementation of such a three-dimensional semiconductor device, various techniques for improving the operational reliability of the semiconductor device have been developed.

SUMMARY

According to an aspect of the present disclosure, there is provided a semiconductor device including: a stack structure including horizontal conductive patterns and interlayer insulating layers, which are alternately stacked in a first direction; gate patterns overlapping with both ends of the stack structure under the stack structure, the gate patterns being spaced apart from each other in a second direction intersecting the first direction; and a channel pattern including vertical parts penetrating the stack structure, and a connection part disposed under the stack structure, the connection part connecting the vertical parts.

According to an aspect of the present disclosure, there is provided a semiconductor device including: a well structure including a first conductivity type dopant; stack structures disposed to be spaced apart from the well structure in a first direction, the stack structures being spaced apart from each other by a slit, the stack structures each including an end region adjacent to the slit and a central region extending from the end region; a gate pattern overlapping with the end region of each of the stack structures under the end region, the gate pattern not overlapping with the central region; a source contact line disposed in the slit, the source contact line further protruding toward the well structure than the gate pattern, the source contact line including a second conductivity type dopant; a well contact line disposed under the source contact line, the well contact line being in contact with the well structure; and a channel layer extending to a space between the well structure and the stack structures by penetrating the central region of each of the stack structures, the channel layer being penetrated by the source contact line and the well contact line.

According to an aspect of the present disclosure, there is provided a semiconductor device including: a stack structure including horizontal conductive patterns and interlayer insulating layers, which are alternately stacked in a first direction; a source contact line dividing the stack structure in a first and a second stack structure; a first gate pattern formed under the first stack structure to overlap in the first direction with an end region of the first stack structure which is adjacent the source contact line; a second gate pattern formed under the second stack structure to overlap with an end region of the second stack structure which is adjacent the source contact line; and a channel pattern including vertical parts penetrating the stack structure, and a connection part disposed under the stack structure, the connection part connecting the vertical parts.

According to an aspect of the present disclosure, there is provided a method of manufacturing a semiconductor device, the method including: forming a sacrificial group having a first conductive pattern embedded therein; forming a stack structure over the sacrificial group, wherein the stack structure includes first material layers and second material layers, which are alternately stacked, and is divided into a first region overlapping with the first conductive pattern and a second region extending from the first region; forming a slit exposing a sidewall of the stack structure therethrough by etching the first region of the stack structure through an etching process that is stopped when the first conductive pattern is exposed; and separating the first conductive pattern into gate patterns by etching a portion of the first conductive pattern exposed through the slit.

According to an aspect of the present disclosure, there is provided a method of manufacturing a semiconductor device, the method including: forming a well structure including a first conductivity type dopant; forming a sacrificial group over the well structure, wherein the sacrificial group has a first conductive pattern embedded therein; forming a stack structure over the sacrificial group, wherein the stack structure includes a first region overlapping with the first conductive pattern and a second region extending from the first region; forming holes that penetrate the second region of the stack structure; opening a horizontal space by removing the sacrificial group through the holes; forming a multi-layered memory layer extending to the inside of the holes from the inside of the horizontal space along a surface of the horizontal space and surfaces of the holes; forming a channel layer on a surface of the multi-layered memory layer; forming a gap-fill insulating layer that is filled in the horizontal space and the holes on the channel layer; exposing the well structure by etching the first region of the stack structure, the first conductive pattern, the multi-layered memory layer, the gap-fill insulating layer, and the channel layer; forming a well contact line that connects the well structure and the channel layer; and forming a source contact line that is connected to the channel layer on the top of the well contact line and includes a second conductivity type dopant.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 4 to 10H are views illustrating the manufacturing method of the semiconductor device according to the embodiment of the present disclosure.

DETAILED DESCRIPTION

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. Various embodiments of the present invention provide a three-dimensional semiconductor device exhibiting improved operational reliability and a manufacturing method thereof.

Figure 1:
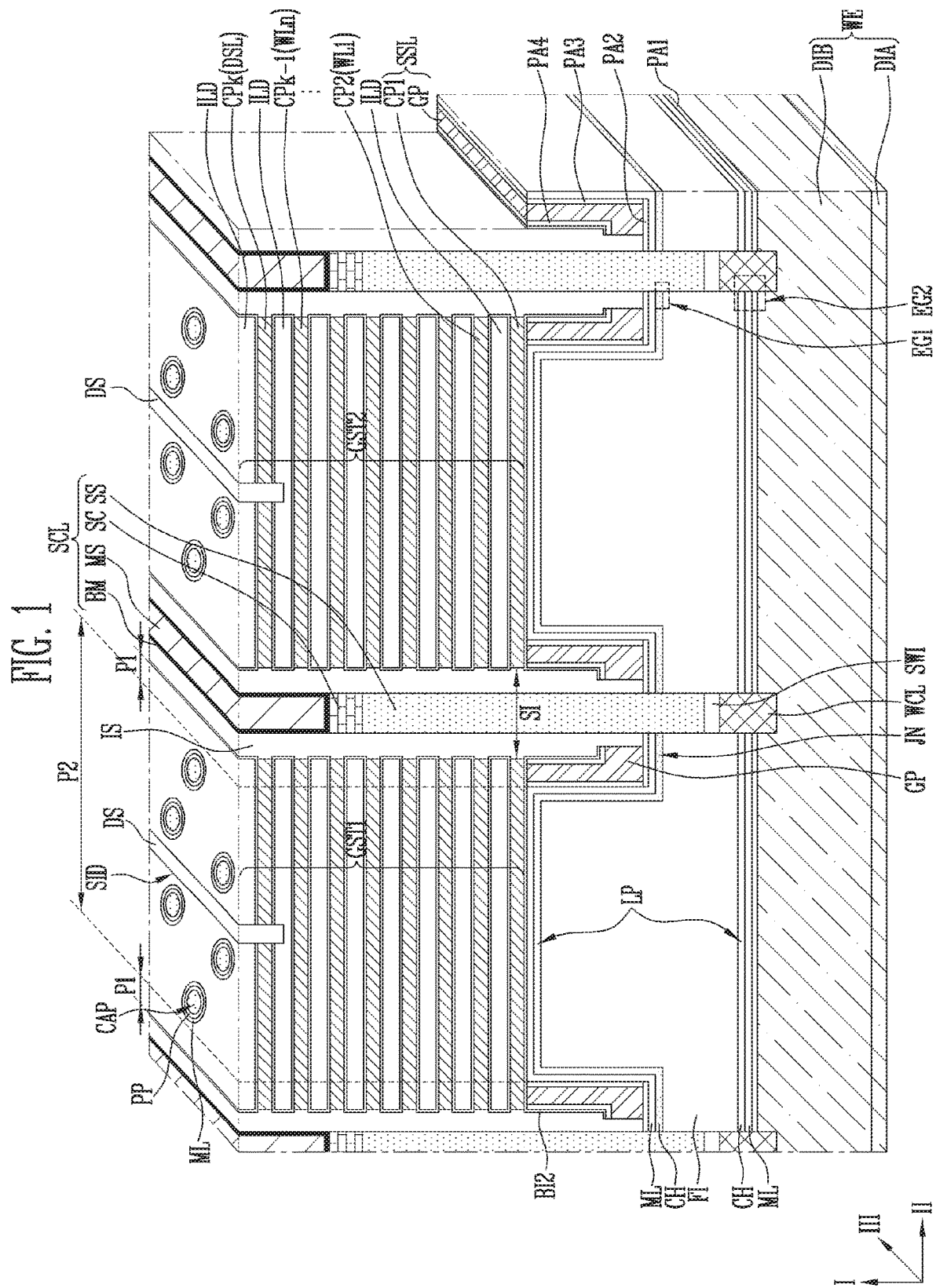
FIG. 1 is a perspective view illustrating a semiconductor device according to an embodiment of the present disclosure.

FIG. 1 is a perspective view illustrating a semiconductor device according to an embodiment of the present disclosure.

Referring to FIG. 1, the semiconductor device according to an embodiment of the present disclosure may include channel patterns CH, stack structures GST1 and GST2 that surround the respective channel patterns CH, a well structure WE that is disposed under the stack structures GST1 and GST2 and includes a first conductivity type dopant, gate patterns GP disposed to be spaced apart from each other under the respective stack structures GST1 and GST2, well contact lines WCL connected to the well structure WE, slits SI that separate the stack structures GST1 and GST2 from each other, and source contact lines SCL disposed in the slits SI to be connected to the channel patterns CH. FIG. 1 illustrates a first stack structure GST1 and a second stack structure GST2, but the number of stack structures separated by the slits SI may be two or more.

Each of the stack structures GST1 and GST2 may include horizontal conductive patterns CP1 to CPk and interlayer insulating layers ILD, which are alternately stacked one by one in a first direction I. Each of the stack structures GST1 and GST2 may be divided into two end or side regions P1 and a central region P2. The end regions P1 are regions corresponding to the two end or side regions of each of the stack structures GST1 and GST2 which are adjacent to the slits SI. The central region P2 of each stack structure GST1 and GST2 is the remaining region of each stack structure that extends between the end regions P1 of each stack structure.

The interlayer insulating layers ILD may be formed of an insulating material such as an oxide layer. The horizontal conductive patterns CP1 to CPk and the gate patterns GP correspond to gate lines SSL, WL1 to WLn, and DSL used as gate electrodes of transistors. The interlayer insulating layers ILD may be disposed between adjacent horizontal conductive patterns CP1 to CPk in the first direction I, respectively. The horizontal conductive patterns CP1 to CPk and the gate patterns GP may be formed of a conductive material. Furthermore, the horizontal conductive patterns CP1 to CPk may be formed of a conductive material different from that of the gate patterns GP.

The gate patterns GP may be formed of a first conductive layer. The first conductive layer is selected by considering the etching selection ratio thereof to serve as an etch stop layer while a manufacturing process of the semiconductor device is being performed. For example, the first conductive layer may be formed of a doped silicon layer. The first conductive layer may include an n-type dopant. The first conductive layer may be formed thick in the manufacturing process to serve as the etch stop layer. As a result, each of the gate patterns GP may be formed thicker than each of the horizontal conductive patterns CP1 to CPk in the first direction I.

The horizontal conductive patterns CP1 to CPk may be formed of a second conductive layer different from the first conductive layer of the gate patterns GP. The horizontal conductive patterns CP1 to CPk may be formed of the same conductive material. The horizontal conductive patterns CP1 to CPk may be formed of a conductive material having a resistance lower than that of the gate patterns GP. For example, each of the horizontal conductive patterns CP1 to CPk may include at least one of a metal layer and a metal silicide layer. The horizontal conductive patterns CP1 to CPk may be formed of a low resistivity tungsten.

The gate patterns GP disposed under the respective stack structures GST1 and GST2 are spaced part from each other in a second direction II intersecting the first direction I. The gate patterns GP are used as source select lines SSL.

A first horizontal conductive pattern CP1 disposed closest to the gate patterns GP among the horizontal conductive patterns CP1 to CPk may be used as a source select line SSL connected to a gate electrode of a source select transistor.

More specifically, the first horizontal conductive pattern CP1 and a pair of gate patterns GP overlapping with a lower portion thereof may be electrically connected to constitute one source select line SSL. The first horizontal conductive pattern CP1 and the gate patterns GP may be electrically connected by contact plugs (not shown).

Alternatively, the first horizontal conductive pattern CP1 and the gate patterns GP may not be in direct contact with each other and not be connected each other by a contact plug. In this case, although a voltage is applied to any one of the first horizontal conductive pattern CP1 and the gate patterns GP, the voltage may be applied to all of the first horizontal conductive pattern CP1 and the corresponding gate patterns GP via a capacitive coupling phenomenon. That is, the gate patterns GP may operate through capacitive coupling with the first horizontal conductive pattern CP1 adjacent to the gate patterns GP.

An uppermost horizontal conductive pattern CPk disposed most distant from the gate patterns GP among the horizontal conductive patterns CP1 to CPk may be used as a drain select line DSL connected to a gate electrode of a drain select transistor. Horizontal conductive patterns CP2 to CPk−1 between the drain select line DSL and the source select line SSL may be used as word lines WL1 to WLn connected to gate electrodes of memory cell transistors.

FIG. 1 illustrates a case where the first horizontal conductive pattern CP1 is used as the source select line SSL, and the uppermost horizontal conductive pattern CPk is used as the drain select line DSL, but the present disclosure is not limited thereto. For example, one or more horizontal conductive patterns sequentially disposed in the upper direction from the first horizontal conductive pattern CP1 among the horizontal conductive patterns CP1 to CPk may be used as the source select line SSL, and one or more horizontal conductive patterns sequentially disposed in the lower direction from the uppermost horizontal conductive pattern CPk among the horizontal conductive patterns CP1 to CPk may be used as the drain select line DSL. The word lines WL1 to WLn are stacked to be spaced apart from each other between the source select line SSL and the drain select line DSL.

The source select line SSL and the word lines WL1 to WLn may be disposed between adjacent slits SI. A drain isolation slit SID may be further disposed between adjacent slits SI. The drain isolation slit SID extends in the first direction I and a third direction III to penetrate through a horizontal conductive pattern (e.g., CPk) used as the drain select line DSL. The first and third directions I and III intersect each other. The drain isolation slit SID is filled with a drain isolation insulating layer DS. Drain select lines DSL disposed in the same layer between adjacent slits SI are isolated from each other by the drain isolation insulating layer DS. The depth of the drain isolation slit SID and the drain isolation insulating layer DS may be controlled such that the drain isolation slit SID and the drain isolation insulating layer DS do not penetrate the source select line SSL and the word lines WL1 to WLn.

Figure 2A:
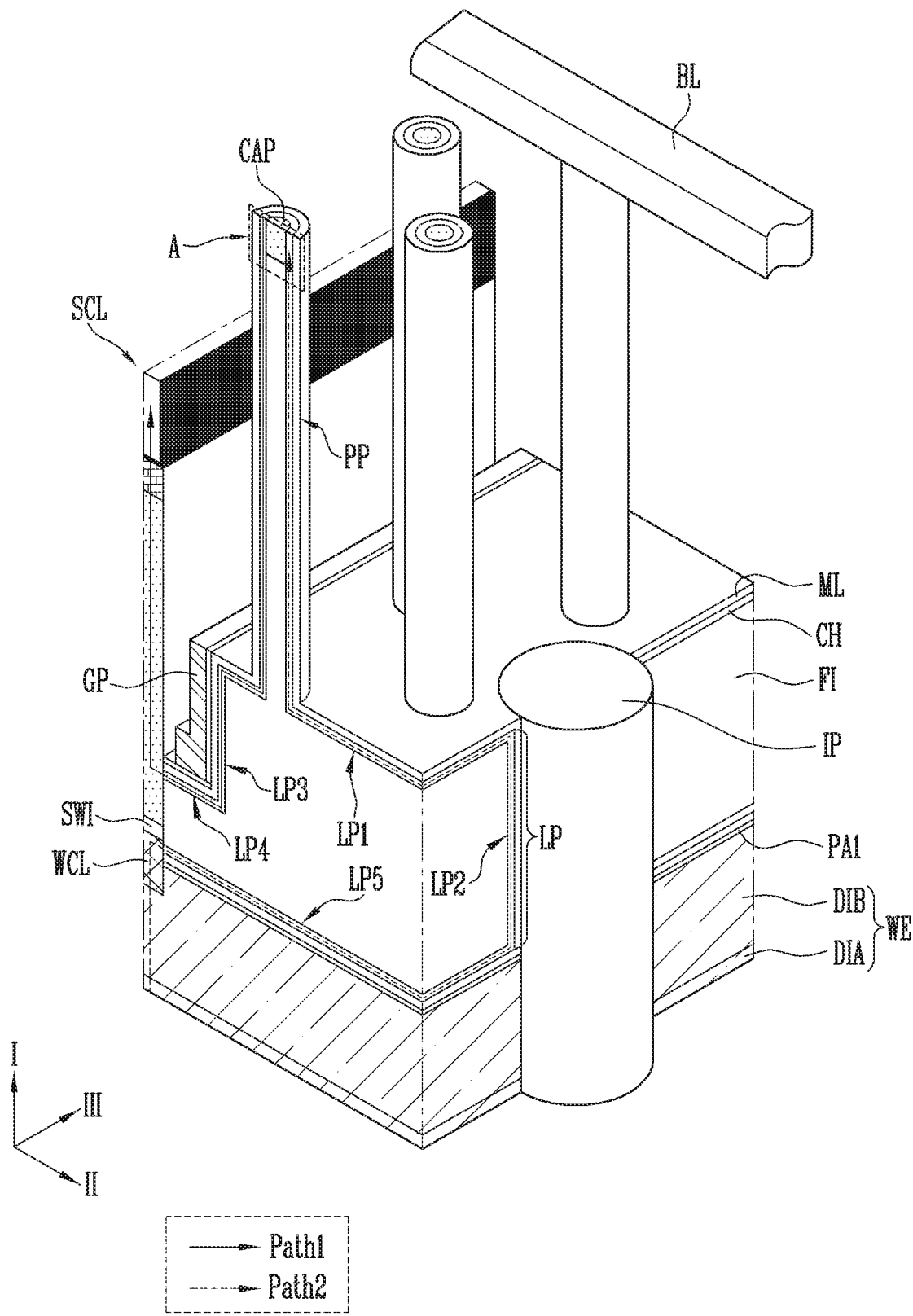
FIGS. 2A and 2B are views illustrating a structure of a channel pattern according to an embodiment of the present disclosure.

Each of the channel patterns CH may include a plurality of spaced apart vertical parts PP and a connection part LP as shown in FIGS. 1 and 2A. The vertical parts PP penetrate the central region P2 of the stack structure GST1 or GST2, and the connection part LP is disposed under the stack structure GST1 or GST2 to connect the vertical parts PP. The vertical parts PP are surrounded by the horizontal conductive patterns CP1 to CPk and the interlayer insulating layers ILD. The connection part LP extends to a space between the well structure WE and the stack structure GST1 or GST2. The connection part LP extends along a bottom surface of the stack structure GST1 or GST2 from the vertical parts PR extends along sidewalk of the gate patterns GP, extends along bottom surfaces of the gate patterns GP, and extends along a top surface of the well structure WE. The vertical parts PP and the connection part LP may be formed in a one-body structure or stated otherwise in a single integrated structure. A one-body channel pattern CH including the vertical parts PP and the connection part LP will be described in more detail with reference to FIG. 2A.

Each of the channel patterns CH may be surrounded by a multi-layered memory pattern ML. The multi-layered memory pattern ML extends along an outer surface of each of the channel patterns CH. The vertical parts PP of each of the channel patterns CH may include top ends surrounding capping patterns CAP. The channel patterns CH may be formed to surround gap-fill insulating patterns FI, respectively. A structure of the gap-fill insulating pattern FI and the channel pattern CH will be described in more detail with reference to FIGS. 2A and 2B.

Each of the channel patterns CH may include first end parts EG1 that are in contact with the source contact lines SCL and second end parts EG2 that are in contact with the well contact lines WCL. The first end part EG1 is a portion of the connection part LP, which extends along the bottom surface of each of the gate patterns GP, and the second end part EG2 is a portion of the connection part LP, which extend along the top surface of the well structure WE. The first end part EG1 and the second end part EG2 may be disposed in the first direction I to be spaced apart from each other, and be spaced apart from each other with the gap-fill insulating pattern FI interposed therebetween. The connection part LP of each of the channel patterns CH is opened toward the slits SI or the source contact lines SCL. The first end part EG1 and the second end part EG2 are defined by an opening of the connection part LP at the slits. Hence, the connection part does not cover the side surfaces of the slits and the side surfaces of the source contact lines SCL.

The slits SL, the source contact lines SCL, and the well contact lines WCL extend along the third direction III intersecting the first and second directions I and II.

The source contact lines SCL may be insulated from the stack structures GST1 and GST2 by spacer insulating layers IS formed on sidewalls of the stack structure GST1 and GST2. The spacer insulating layers IS may be disposed between the source contact lines SCL and the stack structures GST1 and GST2, respectively, and extend to cover the of the gate patterns GP.

The connection part LP of each of the channel patterns CH may extend under the spacer insulating layers IS to overlap with the spacer insulating layers IS. The first end parts EG1 of the connection part LP may protrude further laterally than the sidewalls of the stack structure GST1 or GST2 and the sidewalls of the gate patterns GP. The spacer insulating layers IS may be formed on the protrusion parts of the connection part LP.

The source contact lines SCL may extend in the first direction I to face the sidewalls of the stack structures GST1 and GST2 while being in contact with the first end parts EG1. The source contact lines SCL may protrude further toward the well structure WE than the gate patterns GP.

The source contact line SCL may further include a doped silicon layer SS, a metal silicide layer SC, and a metal layer MS. The doped silicon layer SS may include a second conductivity type dopant different from the first conductivity type dopant. The second conductivity type dopant of the doped silicon layer SS may be provided into the channel patterns CH. The second conductivity type dopant may be an n-type dopant. The metal silicide layer SC is disposed on the doped silicon layer SS, and the metal layer MS is disposed on the metal silicide layer SC. The metal silicide layer SC and the metal layer MS have a resistance lower than that of the doped silicon layer SS, and decrease the resistance of the source contact line SCL. The metal silicide layer SC may include tungsten silicide, nickel silicide, and the like. The metal layer MS may include tungsten and the like. The source contact line SCL may further include a barrier metal layer BM extending along an interface between the metal layer MS and the spacer insulating layer IS and an interface between the metal silicide layer SC and the metal layer MS.

The barrier metal layer BM prevents diffusion of metals, and may include a titanium nitride layer, a tungsten nitride layer, a tantalum nitride layer, and the like.

The connection part LP of each of the channel patterns CH may include a source junction JN. Like the doped silicon layer SS, the source junction JN may include the second conductivity type dopant. The source junction JN is a region in which the second conductivity type dopant is distributed inside a portion of the channel pattern CH extending along the bottom surface of each of the gate patterns GP. The second conductivity type dopant may be an n-type dopant. The distance from the source junction JN to the source select line SSL may be decreased by the gate patterns GP, and therefore, a turn-on current of the source select transistor connected to the source select line SSL may be increased.

The well structure WE may be disposed under the gate patterns GP and extend to overlap with the stack structures GST1 and GST2. The well structure WE is disposed in the first direction I to be spaced apart from the gate patterns GP and the stack structures GST1 and GST2. The well structure WE may include at least one doped silicon layer including the first conductivity type dopant. For example, the well structure WE may be formed in a stack structure of a first doped silicon layer D1A including the first conductivity type dopant at a first concentration and a second doped silicon layer D1B including the first conductivity type dopant at a second concentration. The first doped silicon layer D1A may include the first conductivity type dopant at the first concentration higher than the second concentration. The first conductivity type dopant may be a p-type dopant. Although not shown in the drawing, a driving circuit may be formed on a substrate to overlap with the well structure WE under the well structure WE.

The well contact lines WCL are disposed under the source contact lines SCL between the channel patterns CH. Each of the well contact lines WCL is in direct contact with the well structure WE and the connection part LP by penetrating a portion of the connection part LP extending along the top surface of the well structure WE. The well structure WE and the channel patterns CH may be electrically connected by the well contact lines WCL. The well contact lines WCL may be formed of a conductive material, e.g., a silicon layer.

Inter-well-source insulating layers SWI may be further disposed between the well contact lines WCL and the source contact lines SCL. Each of the inter-well-source insulating layers SWI extends in the third direction III.

Second blocking insulating layers BI2 may be further formed at interfaces between the interlayer insulating layers ILD and the horizontal conductive patterns CP1 to CPk and interfaces between the multi-layered memory pattern ML and the horizontal conductive patterns CP1 to CPk, respectively. The second blocking insulating layer BI2 may extend between the spacer insulating layers IS and the gate patterns GP and between the interlayer insulating layers ILD and the spacer insulating layers IS. The spacer insulating layers IS may extend closer to the well structure WE than the second blocking insulating layer BI2. The second blocking insulating layer BI2 may be formed of an insulating material having a dielectric constant higher than that of a first blocking insulating layer constituting the multi-layered memory pattern ML. A structure of the multi-layered memory pattern ML will be described later with reference to FIG. 2B. The second blocking insulating layer BI2 may be formed of aluminum oxide. Although not shown in the drawing, a barrier layer that prevents direct contact between each of the horizontal conductive patterns CP1 to CPk and the second blocking insulating layer BI2 may be further formed at an interface between each of the horizontal conductive patterns CP1 to CPk and the second blocking insulating layer BI2. The barrier layer may include a titanium nitride layer, a tungsten nitride layer, a tantalum nitride layer, and the like.

In a process of manufacturing the semiconductor device, protective layers PA1 to PA4 for protecting the well structure WE and the gate patterns GP may be formed, and at least one of the protective layers PA1 to PA4 may remain. For example, a first protective layer PA1 may remain on the well structure WE. A second protective layer PA2 may remain on the bottom surface of each of the gate patterns GP. A third protective layer PA3 may remain on the sidewall of each gate pattern GP, which faces the multi-layered memory pattern ML. A fourth protective layer PA4 may remain on the sidewall of each gate pattern GP, which faces the slit SI.

As described above, the gate pattern GP formed of the first conductive layer that may serve as an etch stop layer but increase the resistance of the source select line SSL does not overlap with the entire surface of the stack structure GST1 or GST2. Specifically, the gate pattern GP overlaps with the stack structure GST1 or GST2 under the end regions of the stack structure GST1 or GST2, and does not overlap with the central region of the stack structure GST1 or GST2. Accordingly, in the embodiment of the present disclosure, it is possible to prevent an increase in resistance of the source select line SSL due to the gate pattern GP. At the same time, in the embodiment of the present disclosure, the gate pattern GP is disposed closer to the source junction IN than the first horizontal conductive pattern CP1 of the source select line SSL remains. The gate pattern GP can be used as the gate electrode of the source select transistor. Since the gate pattern GP is disposed close to the source junction JN, the turn-on current of the source select transistor can be increased.

According to the above-described structure, source select transistors may be defined at intersection portions of the vertical parts PP and the source select line SSL, memory cell transistors may be defined at intersection portions of the vertical parts PP and the word lines WL1 to WLn, and drain select transistors may be defined at intersection portions of the vertical parts PP and the drain select line DSL. The memory cell transistors may be three-dimensionally arranged along the first to third directions I to III to constitute a three-dimensional semiconductor device. The source select transistor may include a gate all around (GAA) structure and a planar structure. The GAA structure of the source select transistor is defined by each of the vertical parts PP and a horizontal conductive pattern (e.g., CP1) used as the source select line SSL. The planar structure of the source select transistor is defined by the gate pattern GP and the connection part LP. The drain select transistor and the memory cell transistors may be formed in the GAA structure by the horizontal conductive patterns CP2 to CPk surrounding the vertical parts PP.

The first end part EG1 of the channel pattern CH is electrically connected to the source contact line SCL including the second conductivity type dopant, and the second end part EG2 of the channel pattern CH is electrically connected to the well structure WE including the first conductivity type dopant through the well contact line WCL. In addition, the source contact line SCL and the well contact line WCL are structurally distinguished from each other by the inter-well-source insulating layer SWI. Thus, the flow of current can be controlled to face the source contact lines SCL in a program operation and a read operation, and holes can be supplied through the well structure WE in an erase operation. Accordingly, in the embodiment of the present disclosure, operating characteristics of the semiconductor device can be improved.

Figure 2B:
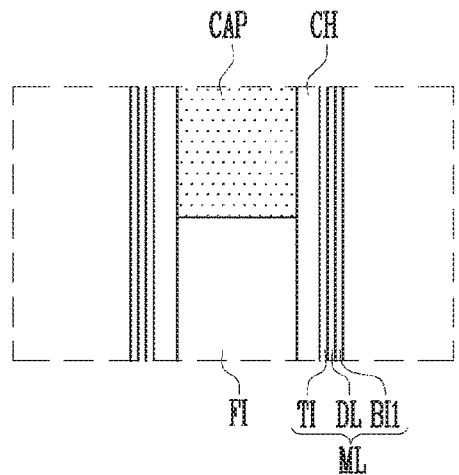

FIGS. 2A and 2B are views illustrating a structure of a channel pattern according to an embodiment of the present disclosure. Specifically, FIG. 2A is a perspective view illustrating a flow of current using the channel pattern and a structure of the channel pattern according to the embodiment of the present disclosure, and FIG. 2B is an enlarged sectional view of region A shown in FIG. 2A. In FIG. 2A, some components are omitted for convenience of illustration.

Referring to FIG. 2A, the semiconductor device may further include a supporting pole IP disposed under the stack structure GST1 or GST2 shown in FIG. 1. Although one supporting pole IP is illustrated in FIG. 2A, a plurality of supporting poles may support the stack structure. The arrangement of supporting poles will be described in more detail with reference to FIG. 5. The supporting pole IP supports a space between the stack structure and a well structure WE, and extends longer toward the well structure WE than a gate pattern GP. For example, the supporting pole IP may be formed in a depth in which the supporting pole IP penetrates the well structure WE.

The channel pattern CH includes vertical parts PP and a connection part LP as described in FIG. 1. The vertical parts PP are parts that extend in a first direction I and are surrounded by the stack structure GST1 or GST2. The connection part LP is a part that connects the vertical parts PP. The connection part LP may include first to fifth parts LP1 to LP5 as shown in FIG. 2A.

The first part LP1 of the connection part LP is a part that extends on the bottom surface of the stack structure GST1 or GST2 shown in FIG. 1 along the bottom surface of the stack structure. The second part LP2 of the connection part LP is a part that extends on a sidewall of the supporting pole IP along the sidewall of the supporting pole IP from the first part LP1. The third part LP3 of the connection part LP is a part that extends on the sidewall of the gate pattern GP along the sidewall of the gate pattern GP from the first part LP1. The fourth part LP4 of the connection part LP is a part that extends on the bottom surface of the gate pattern GP along the bottom surface of the gate pattern GP from the third part LP3. The source junction JN shown in FIG. 1 is defined inside the fourth part LP4. An end portion of the fourth part LP4 of the connection part LP, which is in contact with a source contact line SCL, is defined as the first end part EG1 shown in FIG. 1. The fifth part LP5 of the connection part LP is a part that extends on the well structure WE along the top surface of the well structure WE from the second part LP2. An end portion of the fifth part LP5 of the connection part LP, which is in contact with a well contact line WCL, is defined as the second end part EG2 shown in FIG. 1. The vertical parts PP and the first to fifth parts LP1 to LP5 of the connection part LP may be fabricated as a single integral element without any interfaces therebetween, to thereby form the channel pattern CH.

An outer wall of the channel pattern CH may be surrounded by a multi-layered memory pattern ML. The multi-layered memory pattern ML extends along the outer surfaces of the vertical parts PP and the outer surfaces of the first to fifth parts LP1 to LP5 of the connection part LP. The channel pattern CH may be formed to surround a gap-fill insulating pattern FI. The gap-fill insulating pattern FI may extend to fill in a space between the first and fifth parts LP1 and LP5 of the connection part LP, a space between the fourth and fifth parts LP4 and LP5 of the connection part LP, and a space inside the vertical walls of the vertical parts PP.

The fourth and fifth parts LP4 and LP5 of the connection part LP are isolated from each other with the gap-fill insulating pattern FI interposed therebetween. According to the structure of the connection part LP, the connection part LP has a shape opened toward the source contact line SCL.

The gap-fill insulating pattern FI may be formed with a height lower than that of the vertical parts PP. In this case, capping patterns CAP surrounded by the vertical parts PP may be disposed on the top of the gap-fill insulating pattern FI. Each of the capping patterns CAP may be formed of a semiconductor layer including a second conductivity type dopant. For example, each of the capping patterns CAP may be formed of a doped silicon layer doped with an n-type dopant. Each of the capping patterns CAP may be used as a drain junction.

The supporting pole IP has a sidewall surrounded by the second part LP2 of the connection part LP. The multi-layered memory pattern ML extends between the connection part LP and the supporting pole IP.

Each of the vertical parts PP of the channel pattern CH may be connected to a bit line BL corresponding thereto. For convenience of description, one bit line BL is illustrated in FIG. 2A. However, the semiconductor device may include a plurality of bit lines, and the layout of bit lines may be variously designed.

According to the above-described structure, a first current flow path Path1 may be formed during a read operation of the semiconductor device. The first current flow path Path1 is formed inside the channel pattern CH connected between the bit line BL and the source contact line SCL. In the read operation, the bit line BL may be precharged to a predetermined level. Also, in the read operation, a turn-on voltage may be applied to the drain select line DSL and the source select line SSL, which are shown in FIG. 1. If voltage levels applied to the word lines WL shown in FIG. 1 are higher than threshold voltages of the memory cell transistors connected to the word lines WL, a channel may be formed in the channel pattern CH between the bit line BL and the source contact line SCL, and a precharge level of the bit line BL may be discharged through a ground (not shown) electrically connected to the source contact line SCL.

A second current flow path Path2 may be formed during an erase operation of the semiconductor device. The second current flow path Path2 is formed inside the channel pattern CH connected between the bit line BL and the well structure WE. In the erase operation, an erase voltage may be applied to the well structure WE. Holes may be injected into the channel pattern CH by the erase voltage applied to the well structure WE.

An inter-well-source insulating layer SWI disposed between the source contact line SCL and the well contact line WCL can reduce leakage current between the source junction JN and the well structure WE.

Referring to FIG. 2B, the channel pattern CH may include an inner wall and an outer wall, which face directions opposite to each other. The inner wall of the channel pattern CH is defined as a surface that faces the capping pattern CAP and the gap-fill insulating pattern FI. The multi-layered memory pattern ML may surround the outer wall of the channel pattern CH.

The multi-layered memory pattern ML may include a tunnel insulating layer TI surrounding the channel pattern CH, a data storage layer DL surrounding the tunnel insulating layer TI, and a first blocking insulating layer BI1 surrounding the data storage layer DL. The data storage layer DL may store data changed using Fowler-Nordheim tunneling caused by a difference in voltage between the channel pattern CH and the word lines WL1 to WLn shown in FIG. 1. To this end, the data storage layer DL may be formed of various materials. For example, the data storage layer DL may be formed of a nitride layer in which charges can be trapped. In addition, the data storage layer DL may include silicon, a phase change material, nanodots, and the like. The first blocking insulating layer BI1 may include an oxide layer capable of blocking charges.

A portion of the multi-layered memory pattern ML disposed between the channel pattern CH and the drain select line DSL shown in FIG. 1 and a portion of the multi-layered memory pattern ML disposed between the channel pattern CH and the source select line SSL shown in FIG. 1 may be used as a gate insulating layer.

Figure 3:
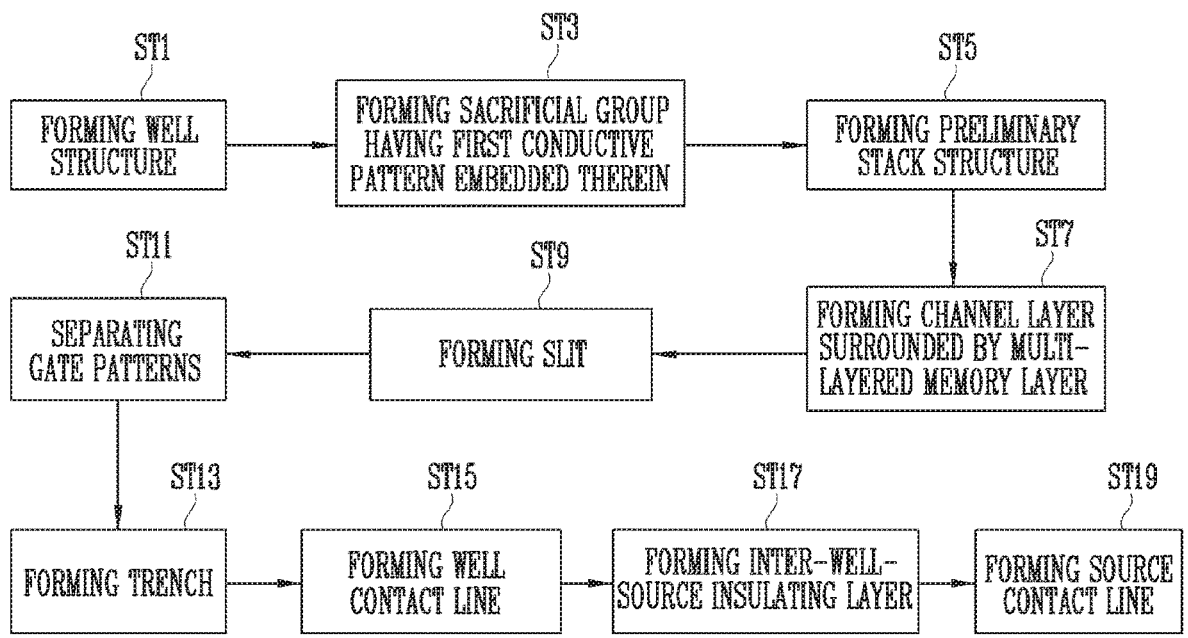
FIG. 3 is a flowchart illustrating a manufacturing method of the semiconductor device according to an embodiment of the present disclosure.

FIG. 3 is a flowchart illustrating a manufacturing method of the semiconductor device according to an embodiment of the present disclosure. Although not shown in the drawing, driving transistors constituting a driving circuit for driving the semiconductor device may be formed on a substrate before step ST1 of forming a well structure. In this case, the step ST1 may be performed on the substrate including the driving transistors. Although not shown in the drawing, bit lines and the like may be formed after step ST19 of forming a source contact line.

Figure 4:
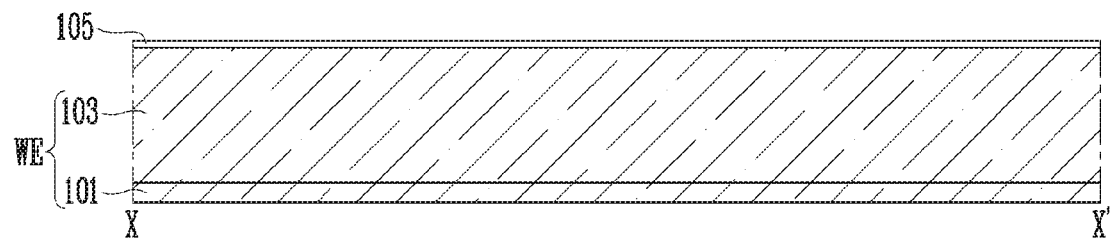

FIG. 4 is a sectional view illustrating the step ST1 shown in FIG. 3.

Referring to FIGS. 3 and 4, the step ST1 of forming the well structure WE may include a step of forming a first doped silicon layer 101 including a first conductivity type dopant at a first concentration and a step of forming a second doped silicon layer 103 including the first conductivity type dopant at a second concentration on the first doped silicon layer 101. The step of forming the second doped silicon layer 103 may include a step of forming an undoped silicon layer on the first doped silicon layer 101 and a step of allowing the first conductivity type dopant inside the first doped silicon layer 101 to be diffused into the undoped silicon layer through a heat treatment process.

Subsequently, a first protective layer 105 may be further formed on the well structure WE. The first protective layer 105 may be formed of a material different from that of a first sacrificial layer formed in a subsequent process. For example, the first protective layer 105 may be formed of an oxide layer.

Referring to FIG. 3, after the step ST1, step ST3 of forming a sacrificial group having a first conductive pattern embedded therein, step ST5 of forming a preliminary stack structure, and step ST7 of forming a channel layer surrounded by a multi-layered memory layer may be sequentially performed.

Figure 5:
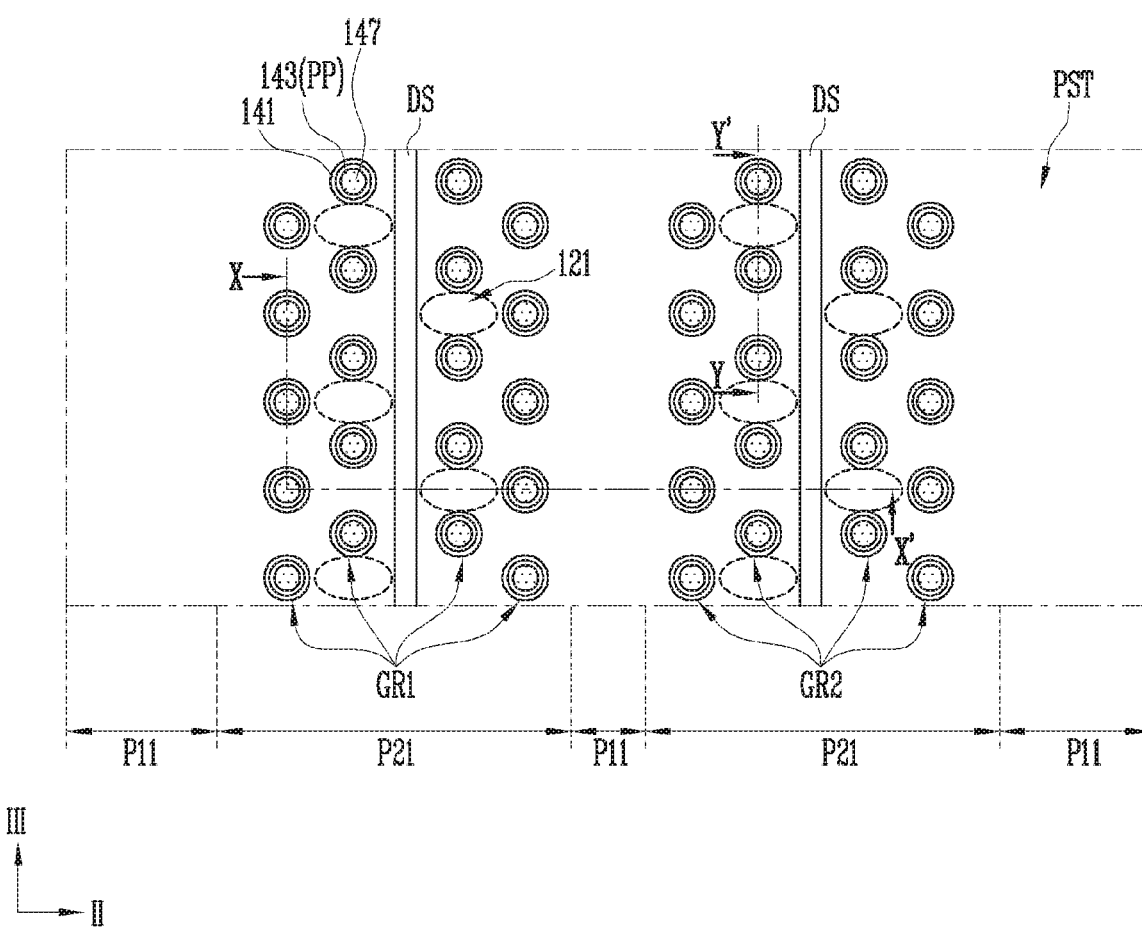

FIG. 5 is a plan view of a product formed through the steps ST3 to ST7. In FIG. 5, a layout of supporting poles 121 disposed under a preliminary stack structure PST is indicated by a dotted line.

Referring to FIG. 5, the preliminary stack structure PST is penetrated by a channel layer 143 surrounded by a multi-layered memory layer 141. FIG. 5 illustrates a plurality of vertical parts PP of the channel layer 143. The vertical parts PP are portions of the channel layer 143 that penetrates the preliminary stack structure PST. Each of the vertical parts PP may be formed to surround a capping pattern 147.

The preliminary stack structure PST may be divided into first regions P11 and second regions P21. The first regions P11 are regions penetrated by slits in a subsequent process, and each of the second regions P21 is a region disposed between two adjacent first regions P11. Each of the second regions P21 may extend from any one of the first regions P11. In the following drawings, two second regions P21 are illustrated for convenience of description. However, the second regions P21 may be alternately disposed with the first regions P11, and two or more second regions P21 may be formed.

The vertical parts PP may penetrate the second regions P21 of the preliminary stack structure PST. The vertical parts PP may be provided into groups GR1 and GR2 that penetrate the respective second regions P21. For example, vertical parts PP penetrating a left second region P21 may be defined as a first group GR1, and vertical parts PP penetrating a right second region P21 may be defined as a second group GR2. The vertical parts PP constituting each of the first and second groups GR1 and GR2 may be formed in a plurality of columns. The vertical parts PP may be arranged in zigzag so as to improve a degree of integration of the semiconductor layer. A drain isolation insulating layer DS may be disposed between a pair of columns disposed at the center among the plurality of columns of the vertical parts PP that constitute each of the first and second groups GR1 and GR2. From a top view, the drain isolation insulating layer DS has a linear shape extending along the third direction III that is the column direction.

The supporting poles 121 may overlap with a region between adjacent vertical parts PP. The supporting poles 121 are not connected to each other, and may be disposed to be spaced apart from each other. For example, as illustrated in FIG. 5, the supporting poles 121 are arranged in the two central columns in each of the groups GR1 and GR2 in a zig-zag pattern. The shape of each supporting pole may be oval as in FIG. 5, however the invention is not limited in this way and any other suitable shape may be employed.

FIGS. 6A to 6J are sectional views illustrating in detail the steps ST3 to ST7 shown in FIG. 3. FIGS. 6A to 6J are sectional views taken along lines X-X' and Y-Y' shown in FIG. 5.

Figure 6A:
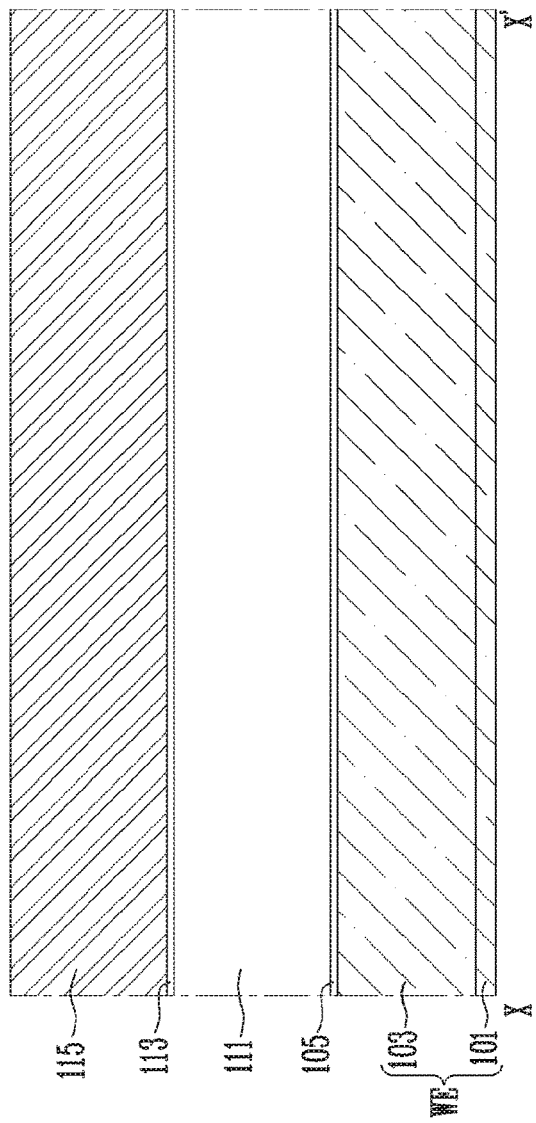

Referring to FIG. 6A, the step ST3 may include a step of forming a first sacrificial layer 111 on the well structure WE and a step of forming a first conductive layer 115 on the first sacrificial layer 111. The first sacrificial layer 111 may be formed on the first protective layer 105. Before the first conductive layer 115 is formed, a second protective layer 113 may be further formed on the first sacrificial layer 111. In this case, the first conductive layer 115 is formed on the second protective layer 113.

The first sacrificial layer 111 and the first conductive layer 115 may be formed of materials having different etching selection ratios. The first conductive layer 115 may be used as a gate electrode, and be formed of a material capable of serving as an etch stop layer during a subsequent slit forming process. For example, the first sacrificial layer 111 may be formed as an undoped silicon layer. The first conductive layer 115 may be formed as a doped silicon layer. More specifically, the first conductive layer 115 may be formed as a doped silicon layer including an n-type dopant.

The second protective layer 113 may be formed of a material different from that of the first sacrificial layer 111 and the first conductive layer 115. For example, the second protective layer 113 may be formed of an oxide layer and the first sacrificial layer 111 may be formed as an undoped silicon layer.

Referring to FIG. 6B, there may be formed supporting poles 121 that penetrate the well structure WE from the first conductive layer 115. The supporting poles 121 are disposed to be spaced apart from each other. The step of forming the supporting poles 121 may include a step of forming a mask pattern by using a photolithography process, a step of forming through-holes by etching the first conductive layer 115, the second protective layer 113, the first sacrificial layer 111, the first protective layer 105, and the well structure WE through an etching process using the mask pattern as an etching barrier, a step of filling an insulating material in the through-holes, a step of planarizing a surface of the insulating material, and a step of removing the remaining mask pattern. An oxide layer may be used as the insulating material for forming the supporting poles 121.

Figure 6C:
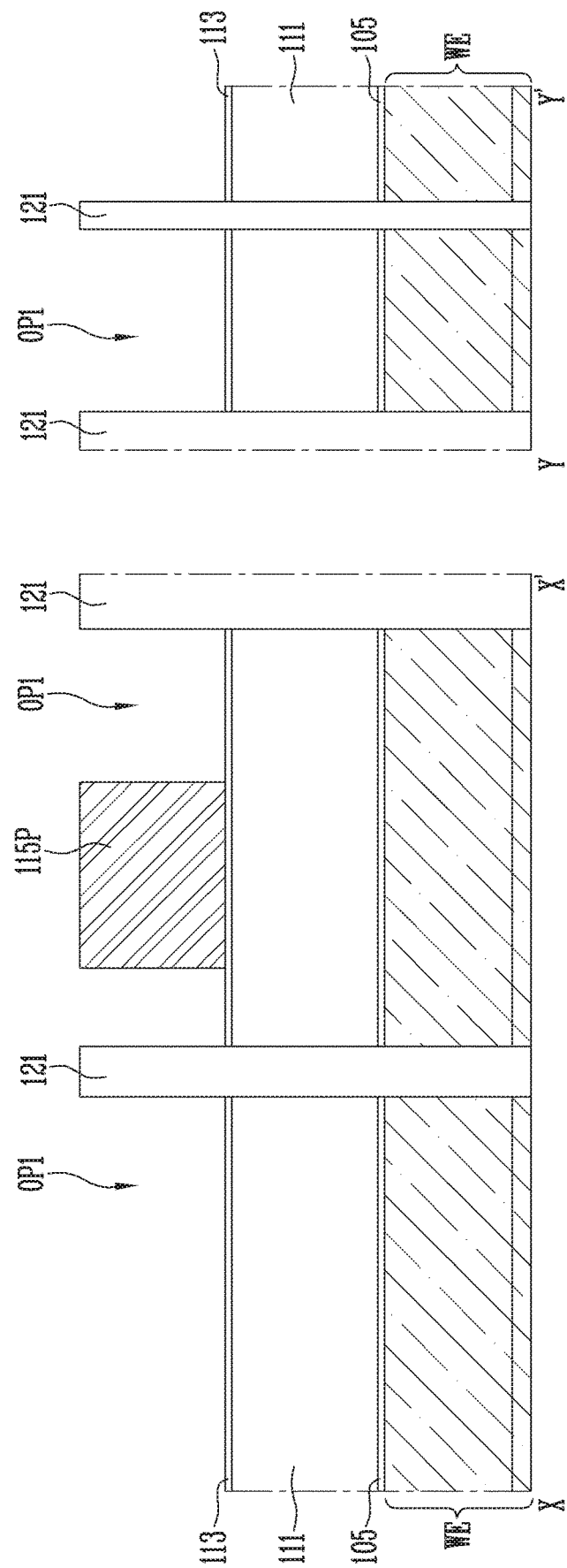

Referring to FIG. 6C, the step ST3 may include a step of forming a first conductive pattern 115P by etching the first conductive layer 115 penetrated by the supporting poles 121. The step of forming the first conductive pattern 115P may include a step of forming a mask pattern by using a photolithography process, a step of etching the first conductive layer 115 through an etching process using the mask pattern as an etching barrier, and a step of removing the remaining mask pattern. A region in which the first conductive layer 115 is removed in the process of forming the first conductive pattern 115P is defined as a first opening OP1. The first opening OP1 may expose the second protective layer 113 and the part of each of the supporting poles 121 which protrudes above the second protective layer 113.

Figure 6D:
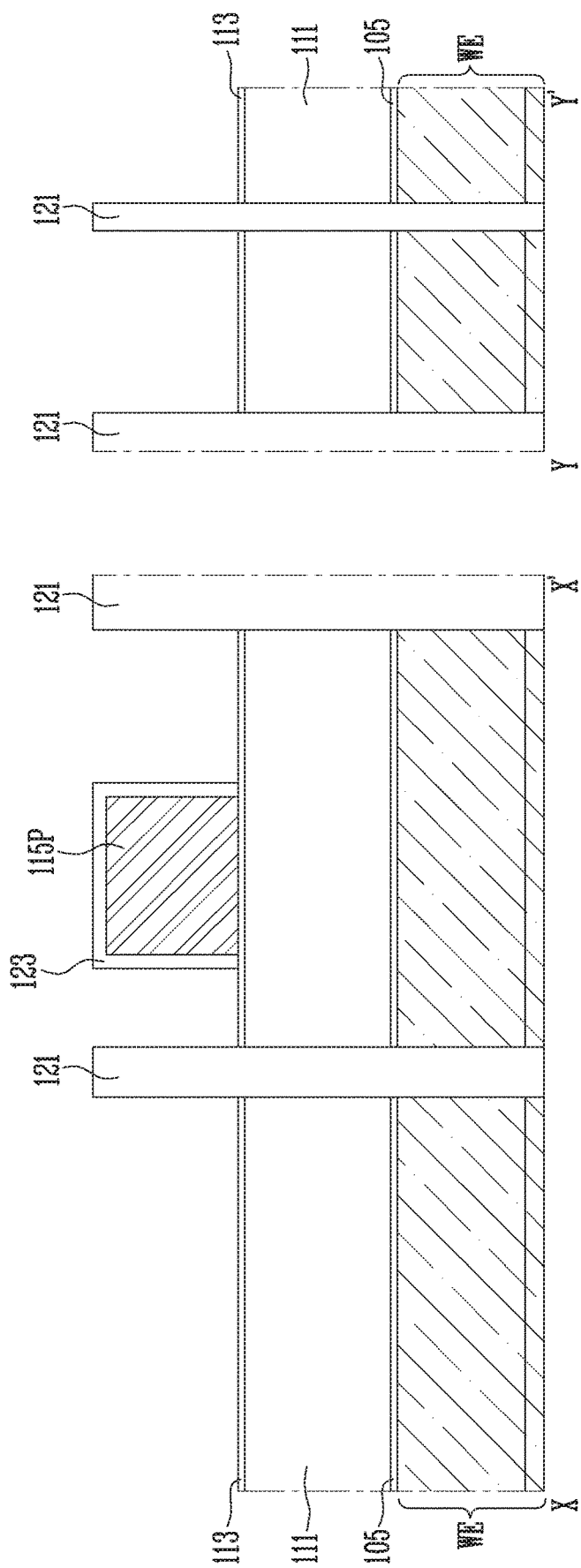

Referring to FIG. 6D, the step ST3 may include a step of forming a third protective layer 123 on a surface of the first conductive pattern 115P. The third protective layer 123 may be formed by oxidizing the surface of the first conductive pattern 115P.

Figure 6E:
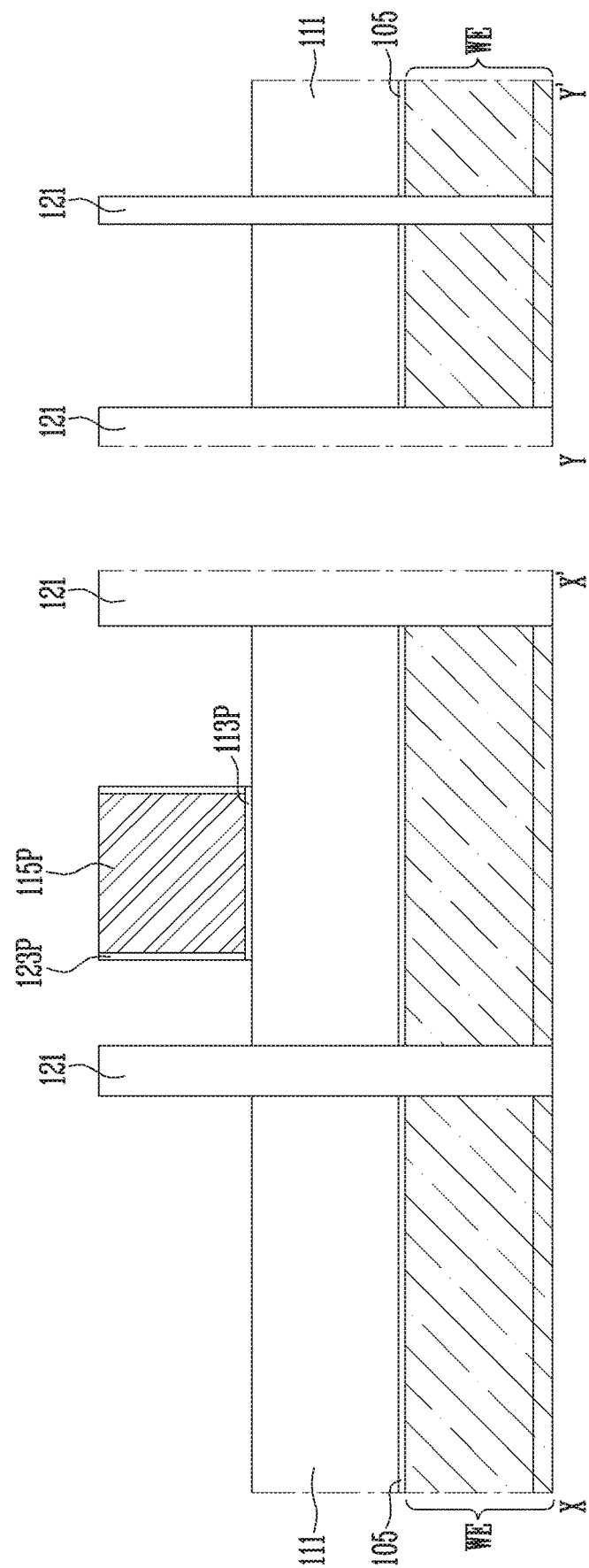

Referring to FIG. 6E, the step ST3 may further include a step of performing an etch-back process such that a portion of the third protective layer and a portion of the second protective layer can be removed. Through the etch-back process, the third protective layer may remain as a third protective pattern 123P on a sidewall of the first conductive pattern 115P, and the second protective layer may remain as a second protective pattern 113P under the first conductive pattern 115P. The first sacrificial layer 111 may be exposed as a portion of the second protective layer, which is not protected by the first conductive pattern 115P, is removed.

Referring to FIG. 6F, in the step ST3, a second sacrificial layer 125 is formed on the first sacrificial layer 111 and fills the first opening OP1. The second sacrificial layer 125 may be formed of a material different from that of the first sacrificial layer 111. The second sacrificial layer 125 may be formed of a material having an etching selection ratio different from that of first and second material layers of a preliminary stack structure formed in a subsequent process. For example, the second sacrificial layer 125 may be formed of a titanium nitride layer (TiN). A surface of the second sacrificial layer 125 may be planarized until the first conductive pattern 115P is exposed.

The first and second sacrificial layers are referred to hereinafter as a sacrificial group SA. Hence, the step ST3 of forming the first conductive pattern 115P embedded in the sacrificial group SA includes sequentially performing the processes described in FIGS. 6A to 6F.

Referring to FIG. 6G, the step ST5 is performed after the step ST3 is completed and may include a step of alternately stacking first material layers 131 and second material layers 133 on the sacrificial group SA along a first direction I. A preliminary stack structure PST including the first material layers 131 and the second material layers 133 may include a first region P11 overlapping with the first conductive pattern 115P and a second region P21 that extends from the first region P11 and does not overlap with the first conductive pattern 115P.

The second material layers 133 are formed of a material different from that of the first material layers 131. The first material layers 131 may be formed of an insulating material for sacrificial layers, and the second material layers 133 may be formed of an insulating material for interlayer insulating layers. More specifically, the first material layers 131 may be formed of a silicon nitride layer, and the second material layers 133 may be formed of a silicon oxide layer.

Although not shown in the drawing, the first material layers 131 may be formed of second conductive layers for the horizontal conductive patterns CP1 to CPk, and the second material layers 133 may be formed of an insulating material for interlayer insulating layers. In this case, the first material layers 131 may be formed of a material different from that of the first conductive pattern 115P. For example, the first material layers 131 may include at least one of a metal silicide layer and a metal layer. The first material layers 131 may be formed of a conductive material having a resistance lower than that of the first conductive pattern 115P. For example, the first material layers 131 may include tungsten.

Some of the first material layers 131 and the second material layers 133 may be penetrated by a drain isolation slit SID. The drain isolation slit SID may be filled with a drain isolation insulating layer DS. The drain isolation insulating layer DS is formed to isolate drain select lines from each other, and the depth in which the drain isolation insulating layer DS is formed may be variously changed depending on a design. The drain isolation slit SID and the drain isolation insulating layer DS may be omitted in some cases.

The step ST7 is performed after the step ST5 and includes forming holes H that expose the second sacrificial layer 125 by penetrating the second region P21 of the preliminary stack structure PST. The first material layers 131 and the second material layers 133 may be etched to form the holes H. When the second sacrificial layer 125 is formed of a material including a metal such as TiN, the width of the bottom surface of each of the holes H may be widely secured using a difference between the etch rate of the preliminary stack structure PST and the etch rate of the metal-based second sacrificial layer 125.

Figure 6H:
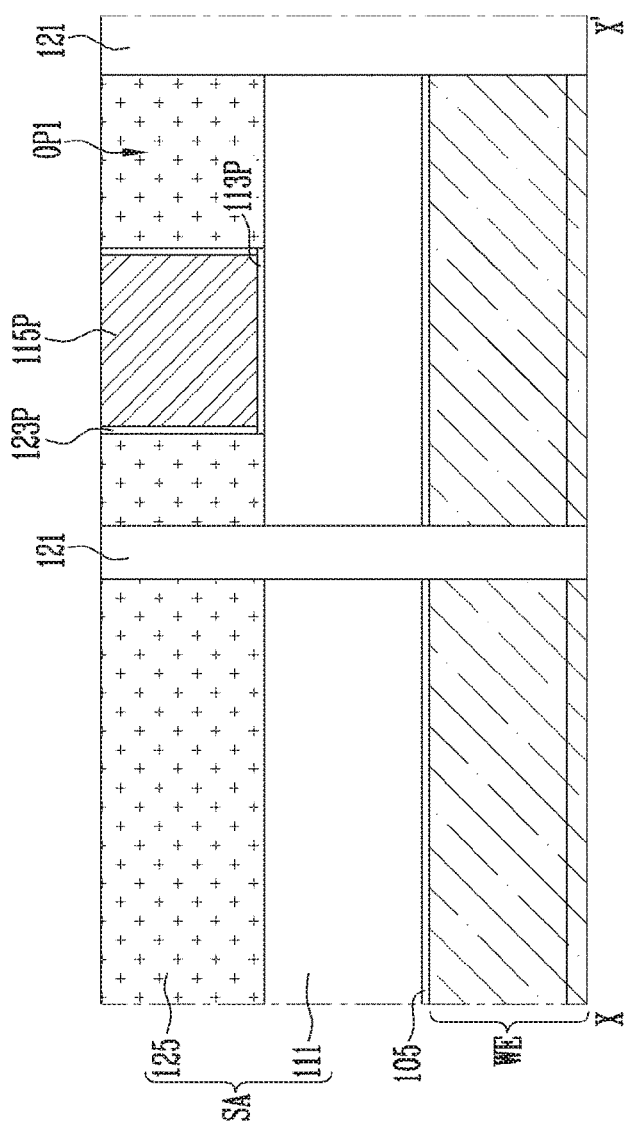

Referring to FIG. 6H, the step ST7 may include a step of selectively removing the second sacrificial layer through the holes H. Accordingly, the first sacrificial layer 111 and the third protective pattern 123P are exposed, and a second opening OP2 connected to the holes H is defined between the preliminary stack structure PST and the first sacrificial layer 111.

Figure 6I:
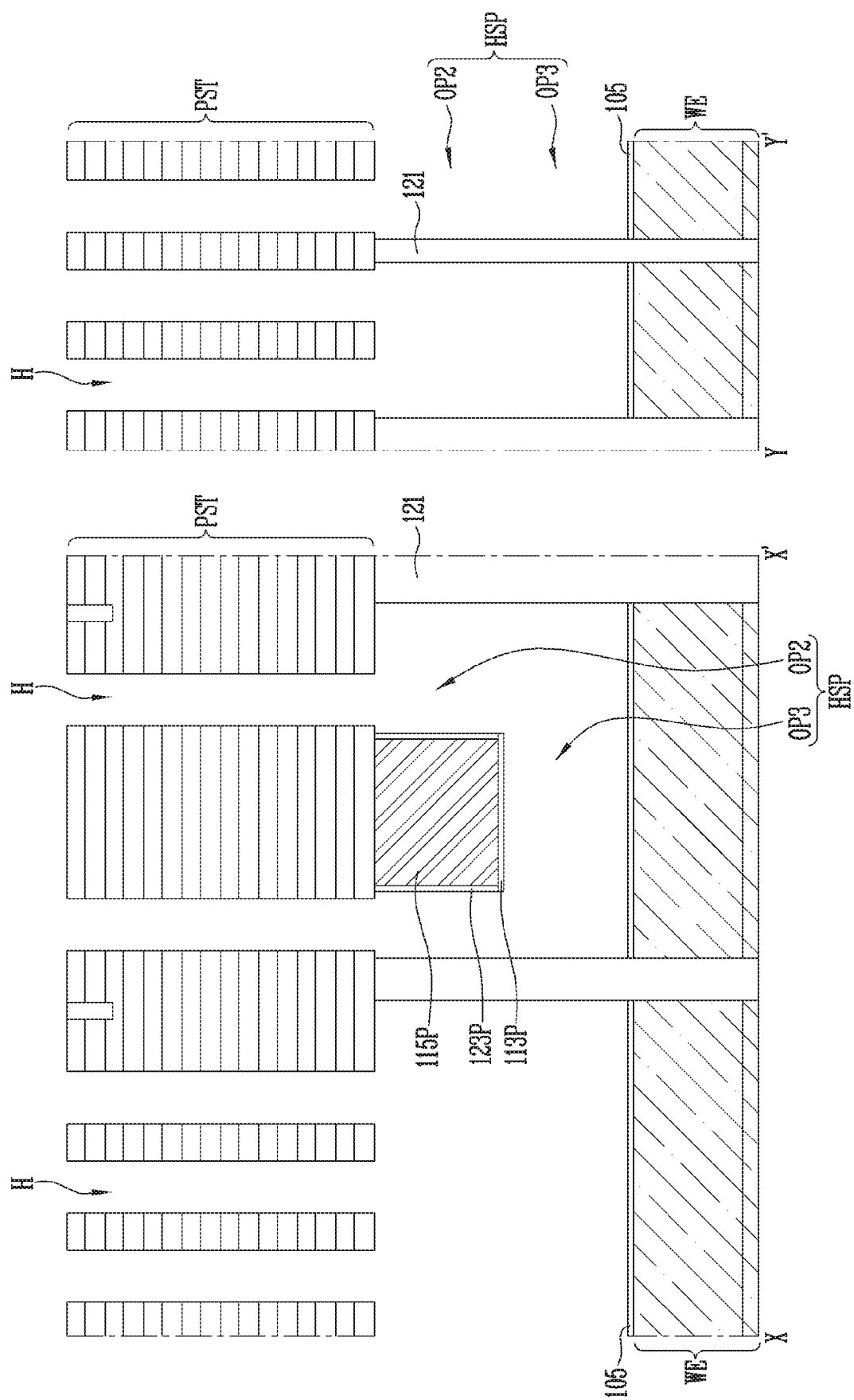

Referring to FIG. 6I, the step ST7 may include a step of selectively removing the first sacrificial layer through the holes H and the second opening OP2. Accordingly, a horizontal space HSP is opened, which is connected to the holes H to extend between the preliminary stack structure PST and the well structure WE and between the first conductive pattern 115P and the well structure WE. The horizontal space HSP may include the second opening OP2 defined in a region in which the second sacrificial layer is removed and a third opening OP3 defined in a region in which the first sacrificial layer is removed.

While the horizontal space HSP is being opened, the first conductive pattern 115P may be protected without loss by the second protective pattern 113P and the third protective pattern 123P. While the horizontal space HSP is being opened, the well structure WE may be protected without loss by the first protective layer 105. The gap of the horizontal space HSP may be maintained as the horizontal space HSP is supported by the supporting poles 121. The first conductive pattern 115P may be maintained without destruction by adhesion by which the first conductive pattern 115P is adhered to the preliminary stack structure PST.

Figure 6J:
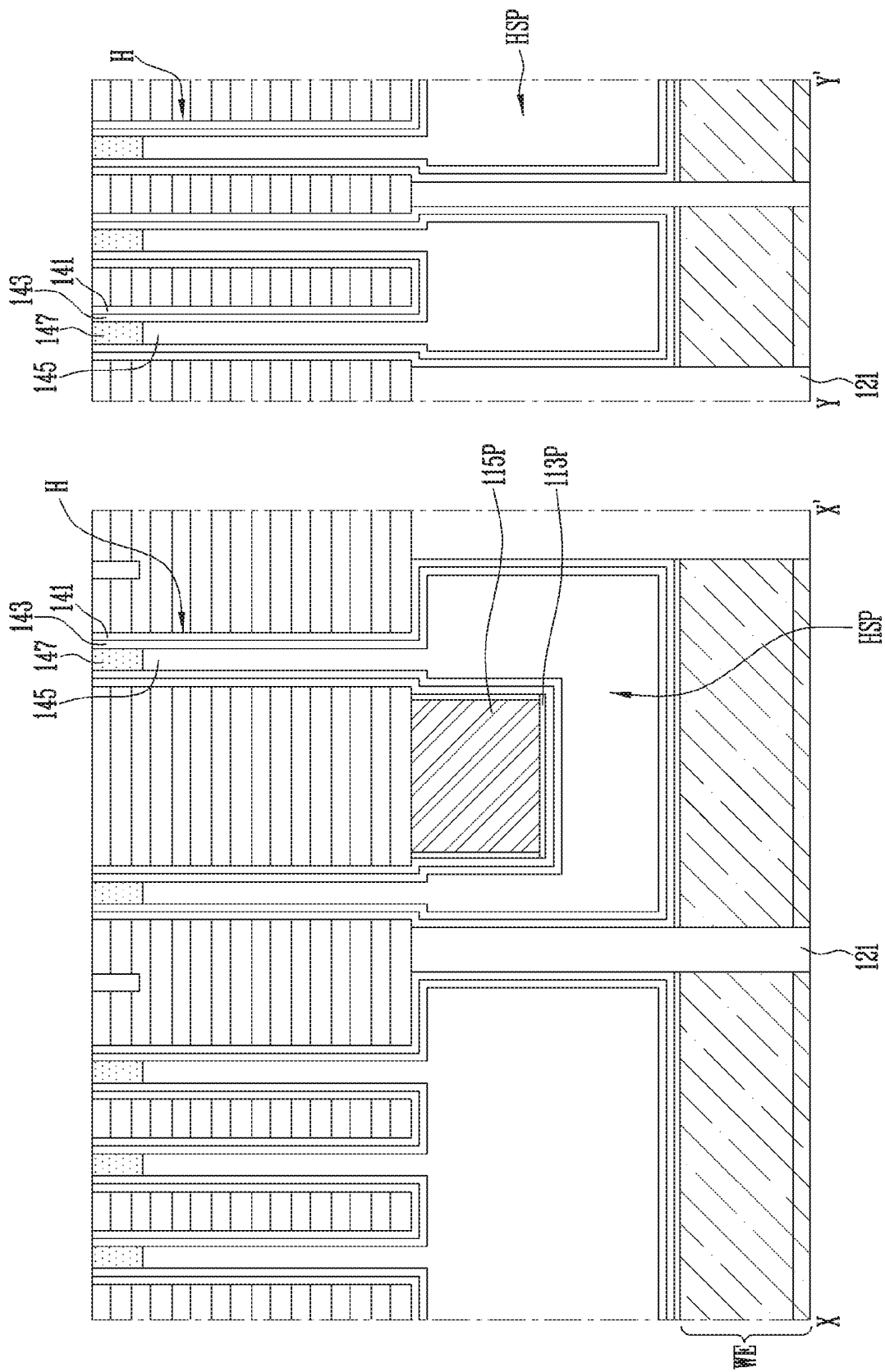

Referring to FIG. 6J, the step ST7 may include a step of forming a multi-layered memory layer 141 that extends along the internal surface of each hole H, the internal surface of the horizontal space HSP, the sidewall of the first conductive pattern 115P, the bottom surface of the first conductive pattern 115P, and the sidewalls of the supporting poles 121. The step of forming the multi-layered memory layer 141 may include a step of forming a first blocking insulating layer, a step of forming a data storage layer on the first blocking insulating layer, and a step of forming a tunnel insulating layer on the data storage layer. The structure and material of each of the first blocking insulating layer, the data storage layer, and the tunnel insulating layer are the same as described in FIG. 2B.

The step ST7 may include a step of forming a channel layer 143 on a surface of the multi-layered memory layer 141. The channel layer 143 may extend along the internal surface of each hole H, the internal surface of the horizontal space HSP, the side all of the first conductive pattern 115P, the bottom surface of the first conductive pattern 115P, and the sidewalls of the supporting poles 121, and may be surrounded by the multi-layered memory layer 141.

The channel layer 143 may be formed as a semiconductor layer. For example, the channel layer 143 may be formed by depositing a silicon layer. The channel layer 143 may be formed as an integrated layer without any interface.

The step ST7 may further include a step of forming a gap-fill insulating layer 145 that extends to the inside of the horizontal space HSP from the inside of the holes H. The gap-fill insulating layer 145 is surrounded by the channel layer 143. The step of forming the gap-fill insulating layer 145 may include a step of filling a material layer having an adequate fluidity inside the holes H and the horizontal space HSP and a step of curing the material layer having fluidity. Polysilazane (PSZ) is an example of a material that has an adequate fluidity and may be used to form the gap-fill insulating layer 145.

A step of recessing a portion of the gap-fill insulating layer 145 such that the height of the gap-fill insulating layer 145 is lower than that of the channel layer 143 may be further performed. Accordingly, the gap-fill insulating layer 145 is formed, which is surrounded by the channel layer 143 and has a height lower than that of the channel layer 143. A central region of the channel layer 143, which is exposed on the gap-fill insulating layer 145, may be filled with a capping pattern 147. The capping pattern 147 may be formed of a doped silicon layer including a second conductivity type dopant.

Referring to FIG. 3, after the step ST7, step ST9 of forming a slit and step ST11 of separating gate patterns from each other may be sequentially performed.

Figure 7:
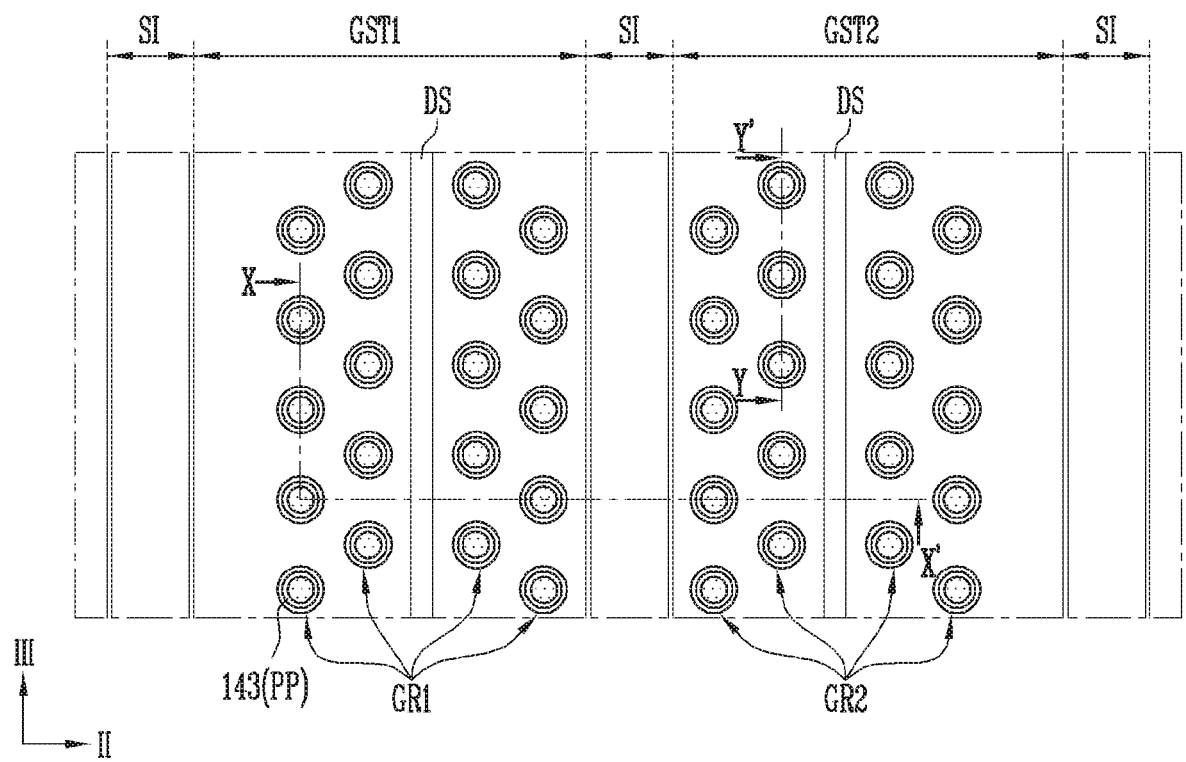

FIG. 7 is a plan view illustrating stack structures GST1 and GST2 isolated from each other through a slit SI formed through the step ST9.

Referring to FIG. 7, the slit SI may be disposed between a first group GR1 configured with some of vertical parts PP of the channel layer 143 and a second group GR2 configured with some other of the vertical parts PP of the channel layer 143. The stack structures GST1 and GST2 may be isolated from each other by the slit SI. The stack structures GST1 and GST2 may remain in a form in which they surround the vertical parts PP. The slit SI may have a linear shape extending along the third direction III when viewed from the top.

FIGS. 8A to 8D are sectional views illustrating in detail the steps ST9 and ST11 shown in FIG. 3. FIGS. 8A to 8D are sectional views taken along lines X-X' and Y-Y' shown in FIG. 7.

Referring to FIG. 8A, the step ST9 may include a step of forming the slit SI that exposes sidewalls of the first material layers 131 and the second material layers 133 by etching the first material layers 131 and the second material layers 133, which correspond to the first region P11 of the preliminary stack structure through a first etching process. The first conductive pattern 115P may be hardly etched during the first etching process. As a result, the first conductive pattern 115P may remain under the slit SI. When the first material layers 131 are formed of a conductive material for conductive patterns, the preliminary stack structure may be separated into the stack structures GST1 and GST2 described in FIG. 7 by the slit SI that penetrates the first material layers 131 and the second material layers 133.

The first conductive pattern 115P is formed of a material different from that of the first material layers 131 and the second material layers 133 by considering a difference between the etch rate of the first s material layers 131 and the etch rate of the second material layers 133. Accordingly, the depth of the slit SI formed through the first etching process can be easily controlled such that the slit SI penetrates the first material layers 131 and the second material layers 133 but does not penetrate the first conductive pattern 115P. In addition, the depth of the slit SI can be uniformly controlled.

The width of the slit SI is formed narrower than that of the first conductive pattern 115P and may enter an upper part of the first conductive pattern 115P. Accordingly, the first conductive pattern 115P remains at both sides of the slit SI.

Referring to FIG. 8B, the step ST9 may further include a step of forming a fourth protective layer 151 by oxidizing a surface of the first conductive pattern 115P through the slit SI.

When the first material layers are formed of an insulating material for sacrificial layers, the step ST9 may include a step of selectively removing the first material layers through the slit SI. Accordingly, gate regions 153 may be opened.

Figure 8C:
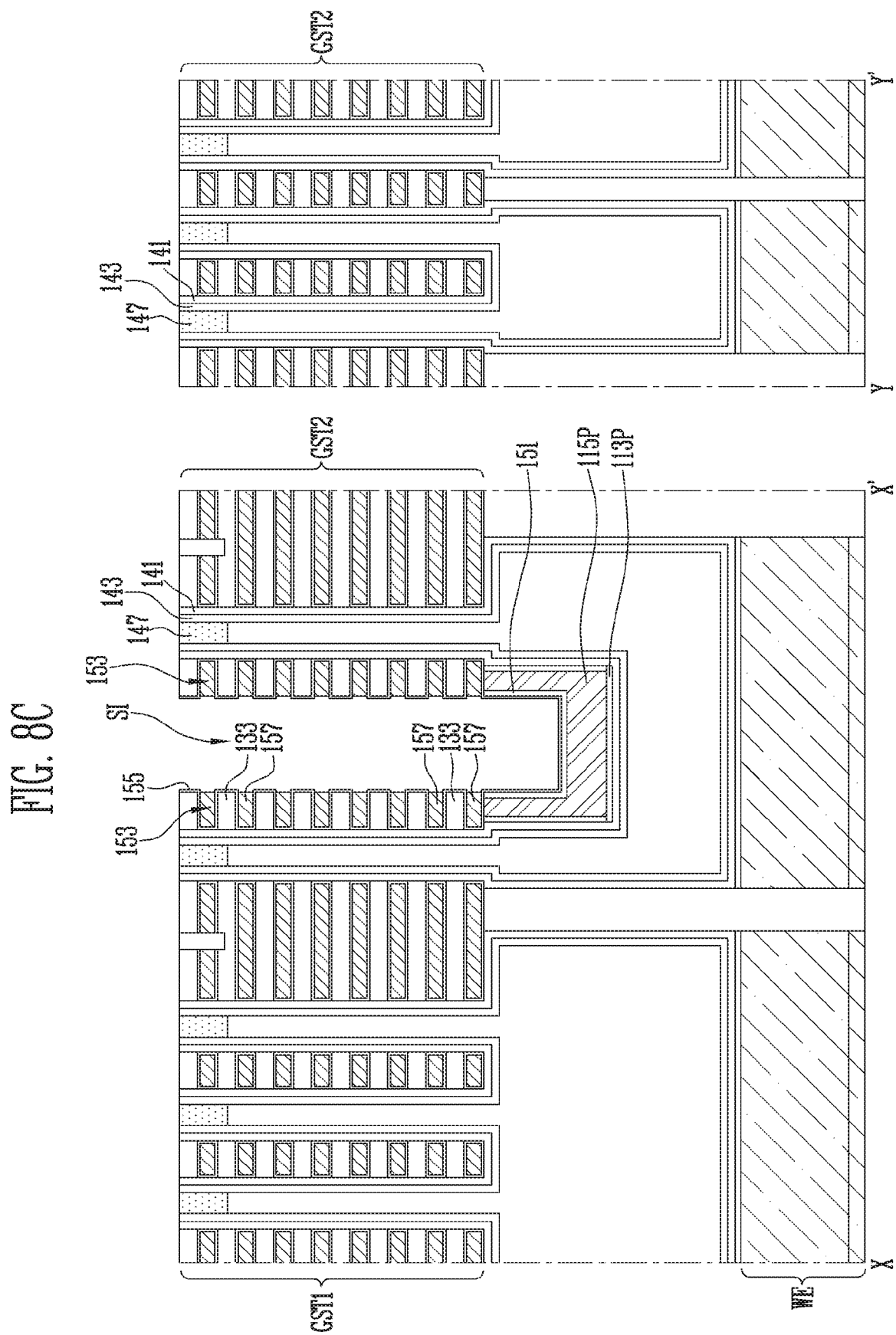

Referring to FIG. 8C, the step ST9 may further include a step forming horizontal conductive patterns 157 in the opened gate regions 153. The step of forming the horizontal conductive patterns 157 may include a step of forming a second blocking insulating layer 155 along surfaces of the gate regions 153 and the slit SI, a step of filling a third material layer having conductivity on the second blocking insulating layer 155, and a step of separating third material layer into the horizontal conductive patterns 157 by removing the third material layer in the slit SI. The third material layer may be a metal layer having a resistance lower than that of the first conductive pattern 115R The fourth protective layer 151 may protect the first conductive pattern 115P while the process of opening the gate regions 153 by removing the first material layers and the process of removing the third material layer are being performed.

According to the processes described in FIGS. 8B and 8C, the first material layers may be replaced with the third material layers that are horizontal conductive patterns 157 through the slit SI. Accordingly, the stack structures GST1 and GST2 in which the horizontal conductive patterns 157 and the second material layers 133 that are interlayer insulating layers are alternately stacked remain in a state in which the stack structures GST1 and GST2 are isolated from each other by the slit SI.

Figure 8D:
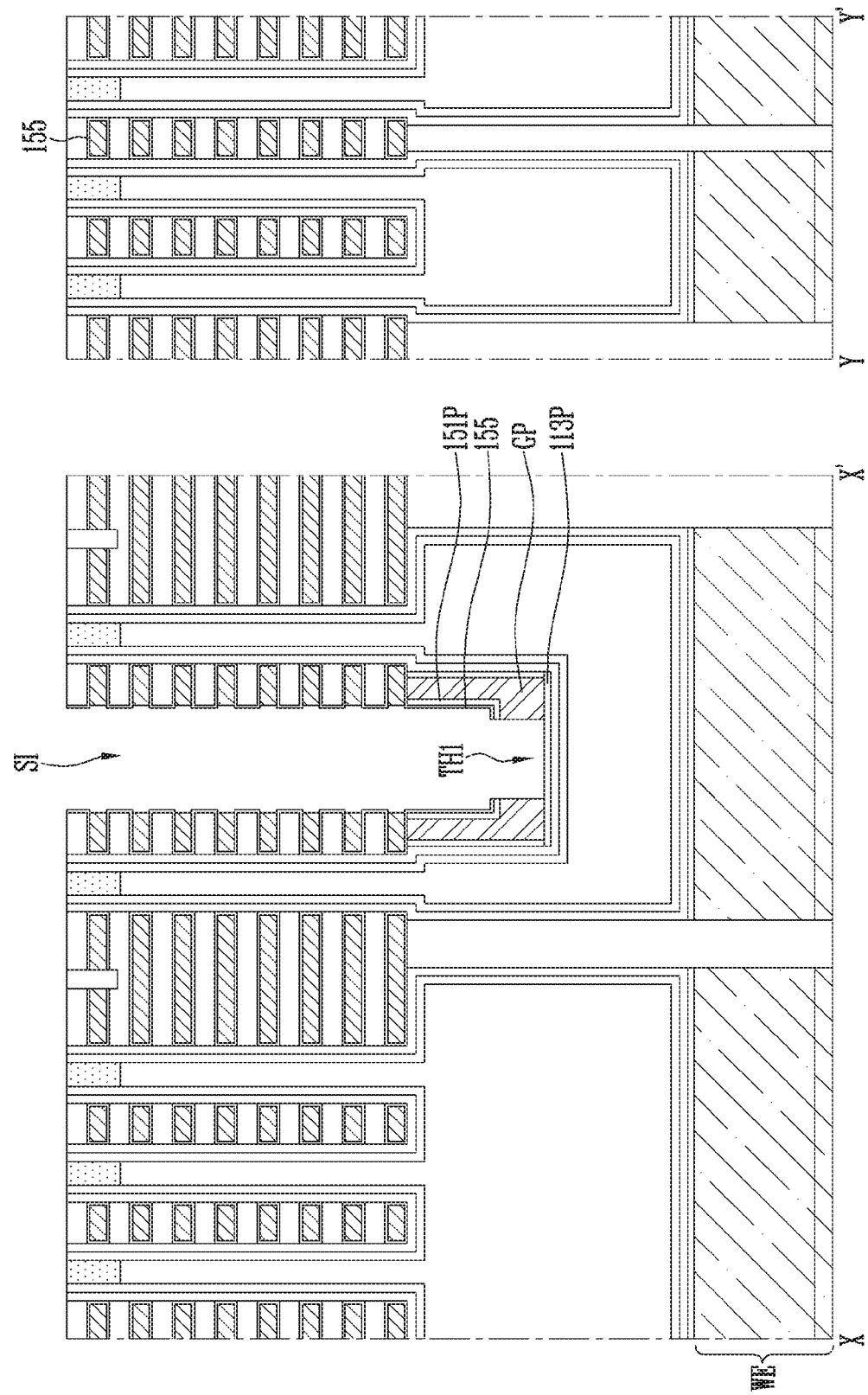

Referring to FIG. 8D, the step ST11 of separating gate patterns GP may include a step of forming a first through part TH1 that completely penetrates the fourth protective layer 151 and the first conductive pattern 115P by etching a portion of each of the second blocking insulating layer 155, the fourth protective layer 151 and the first conductive pattern 115P, which are exposed through the slit SI. The first through part TH1 when viewed from the top also has a linear shape extending in the third direction III that is also the extending direction of the slit SI.

The first conductive pattern may be separated into gate patterns GP by the first through part TH1. The fourth protective layer 151 may remain as a fourth protective pattern 151P on a sidewall of each of the gate patterns GP which are adjacent to the slit SI. The second protective pattern 113P may be exposed by the first through part TH1.

Referring to FIG. 3, after the step ST11, step ST13 of forming a trench that penetrates the gap-fill insulating layer from the multi-layered memory layer, step ST15 of forming a well contact line, step ST17 forming an inter-well-source insulating layer, and step ST19 of forming a source contact line may be sequentially performed.

FIG. 9 is a plan view of a product formed through the steps ST13 to ST19.

Referring to FIG. 9, a source contact line SCL may be formed inside the slit SI. The source contact line SCL may be insulated from the stack structures GST1 and GST2 by spacer insulating layers 161 formed on sidewalls of the slit SI. From a top view, the spacer insulating layers 161 and the source contact line SCL may extend along the third direction III that is the extending direction of the slit SI.

Figure 10A:
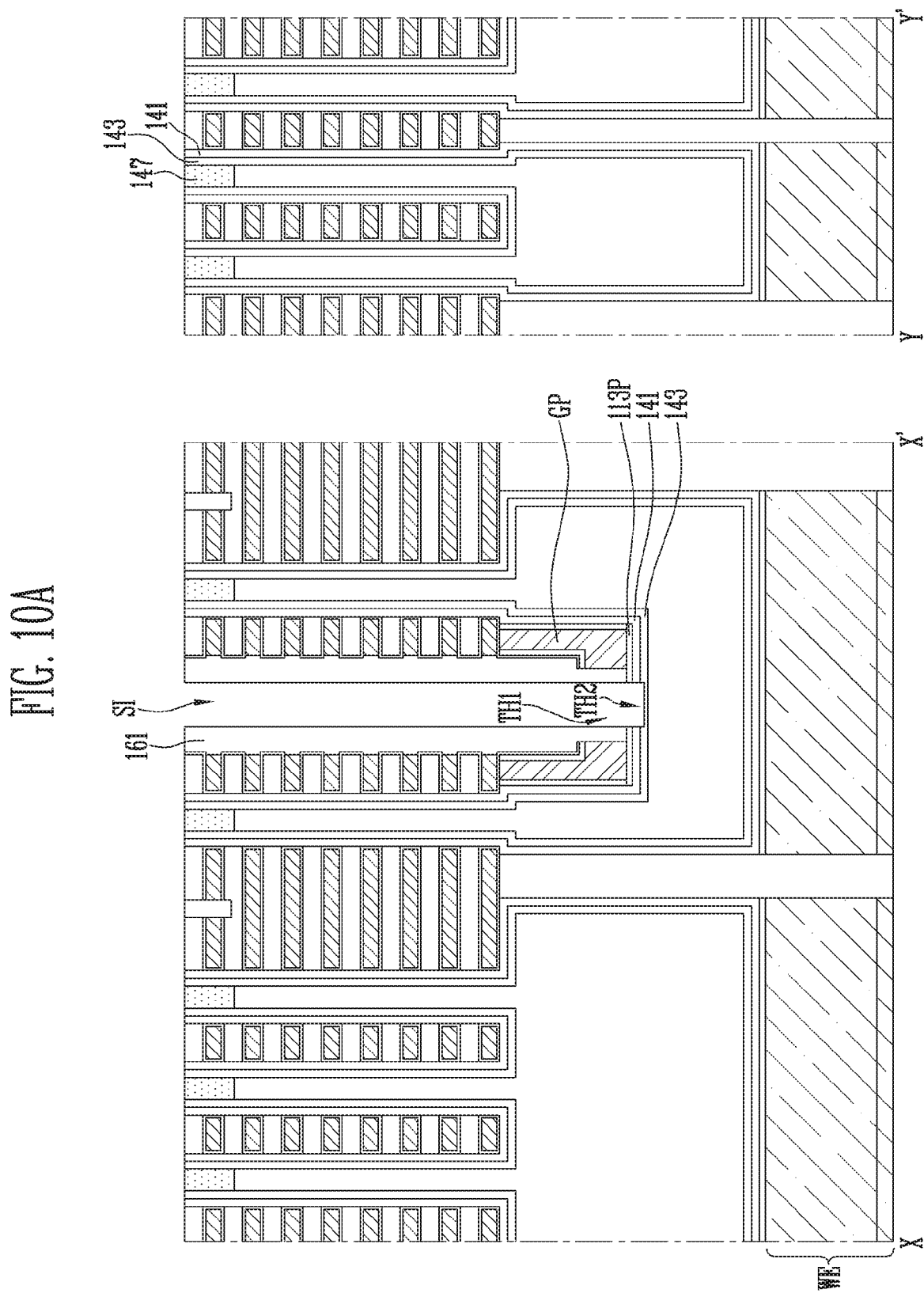
Figure 10B:
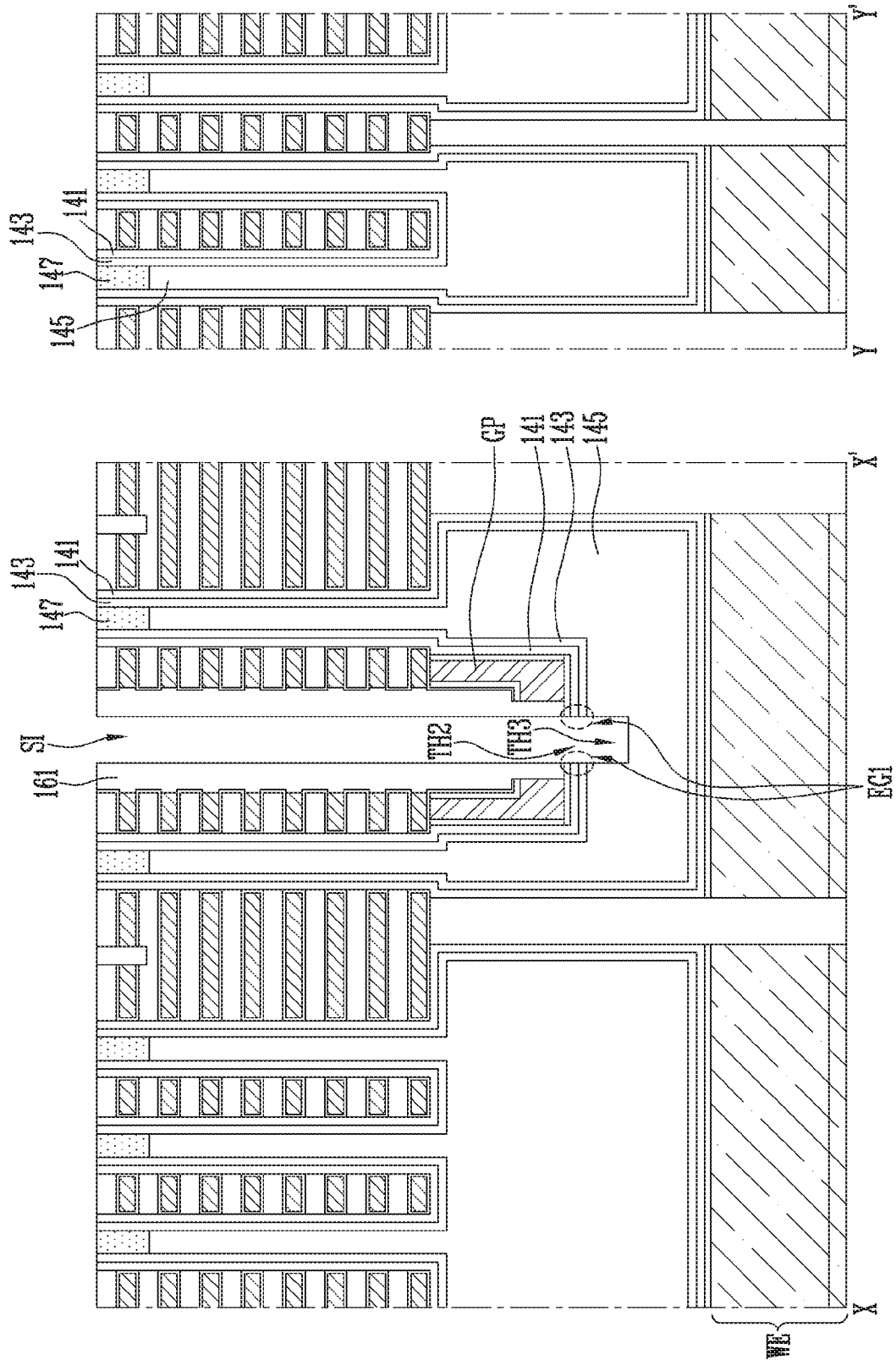
Figure 10C:
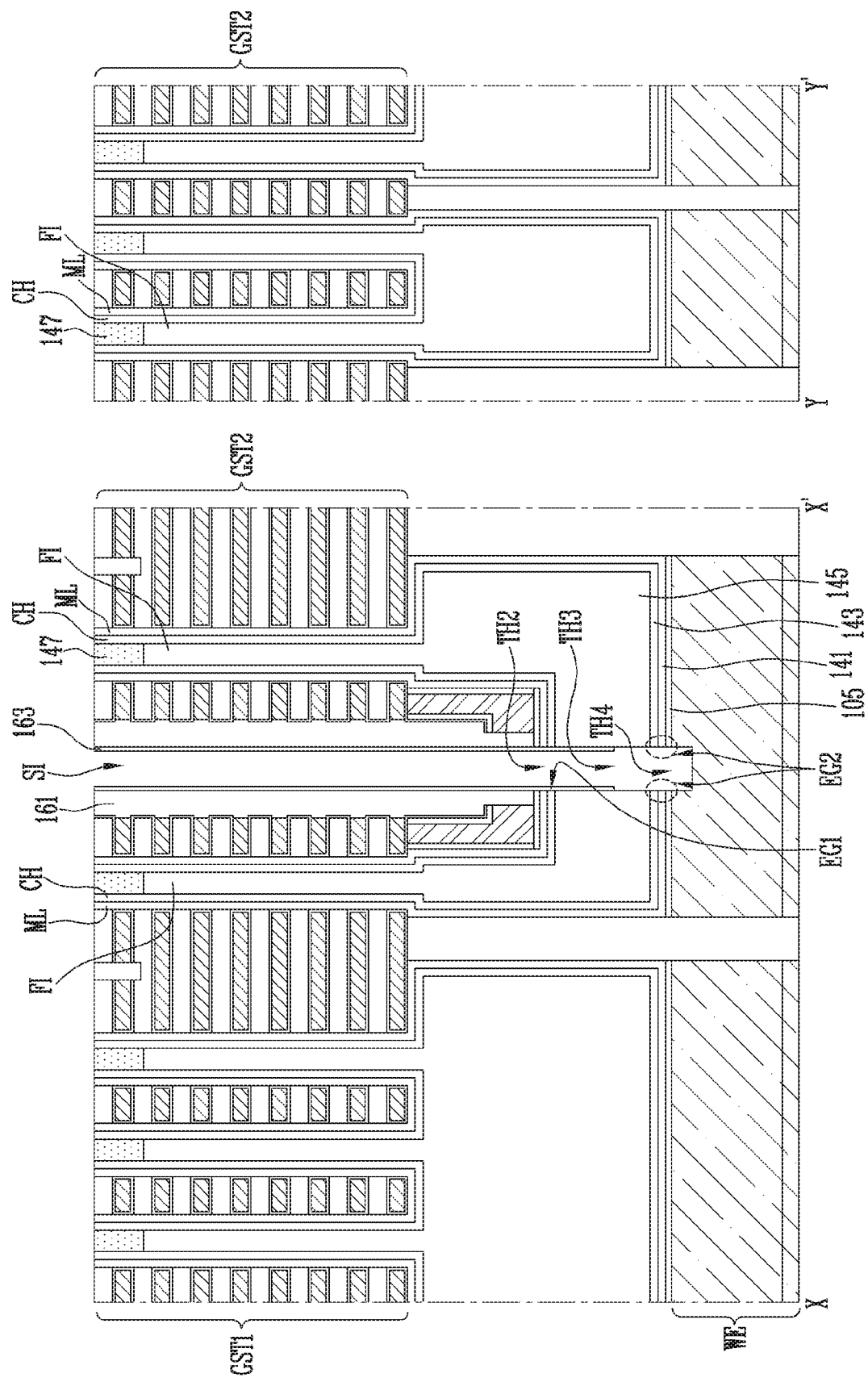
Figure 10D:
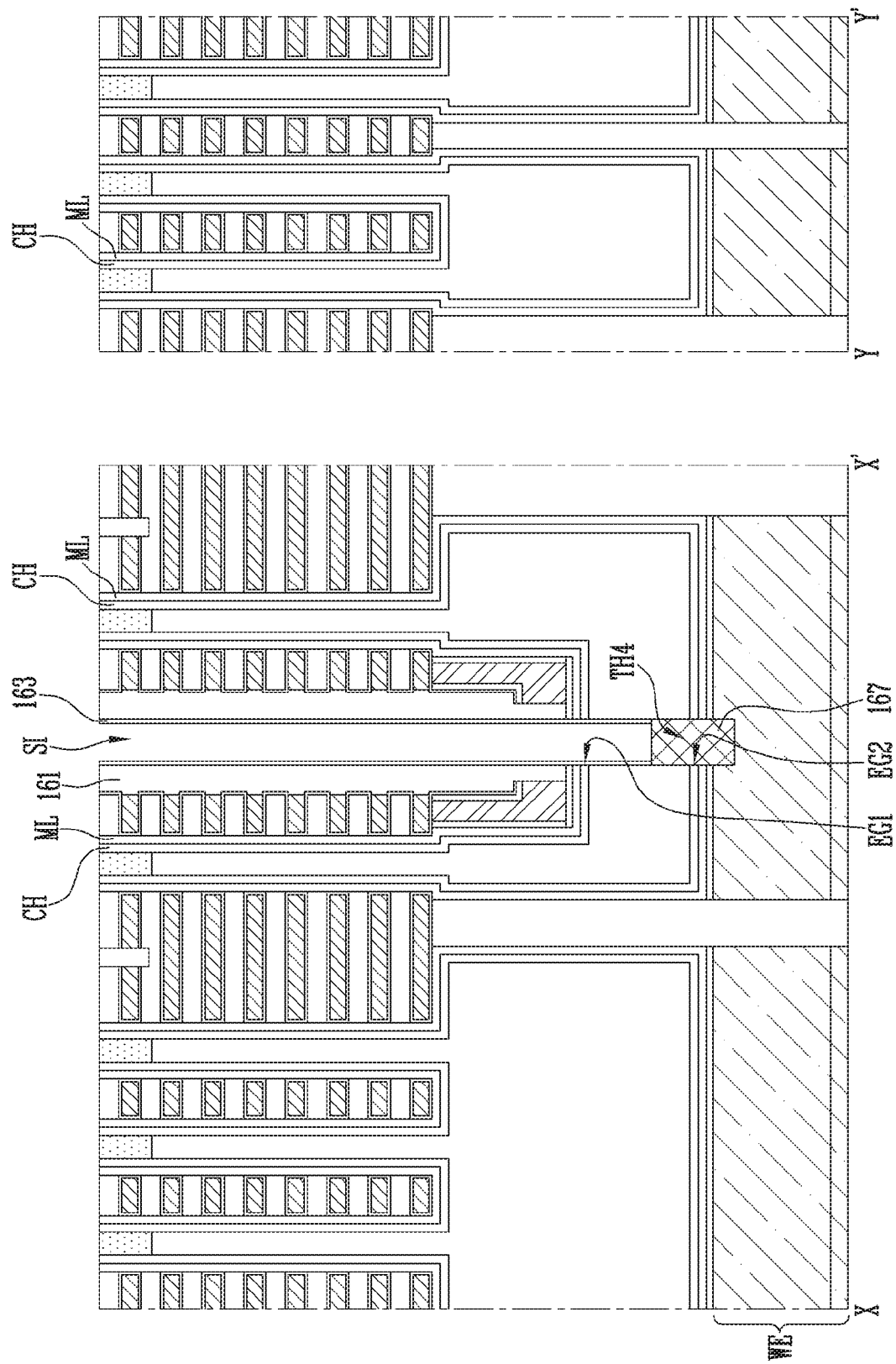
Figure 10I:
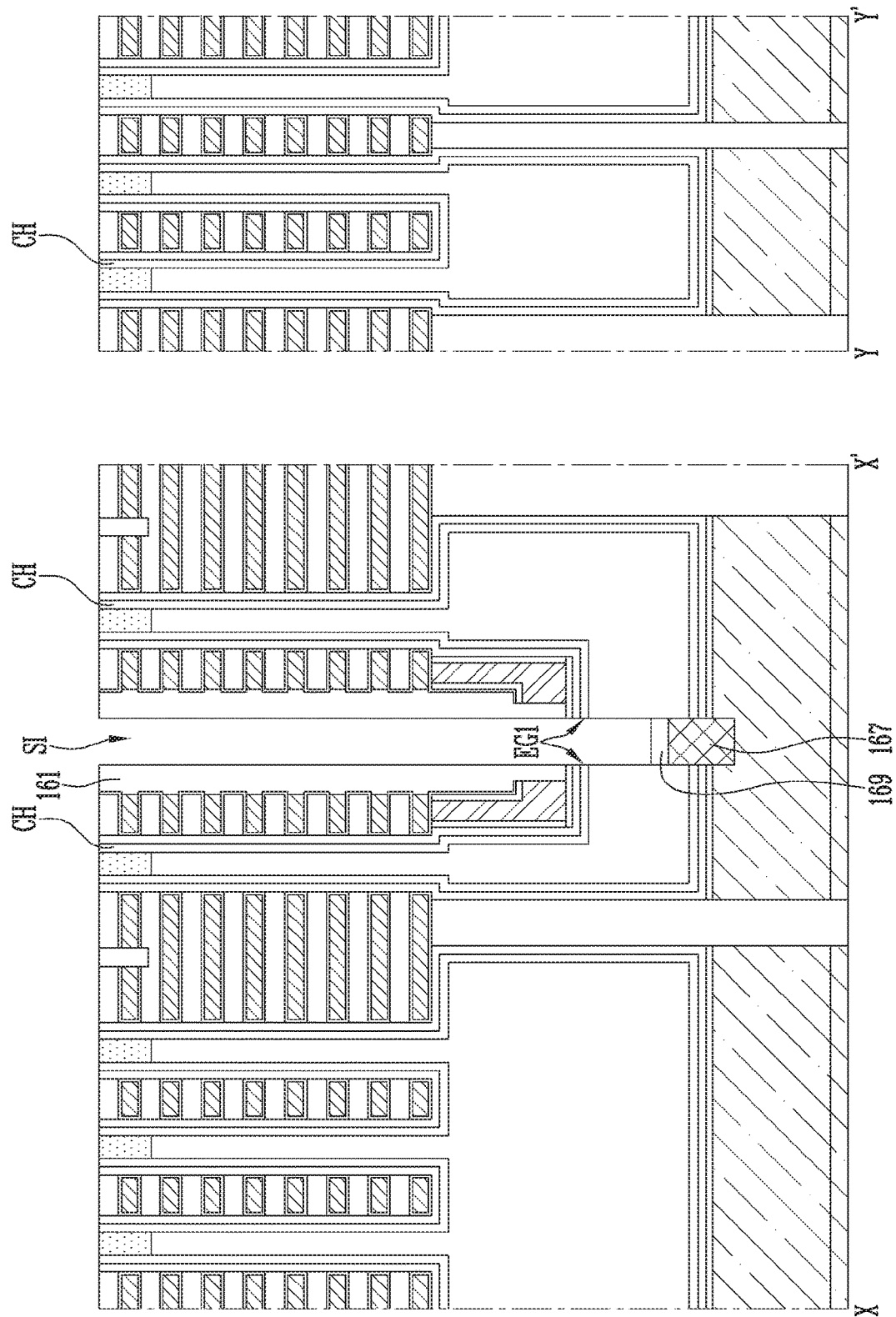
Figure 10G:
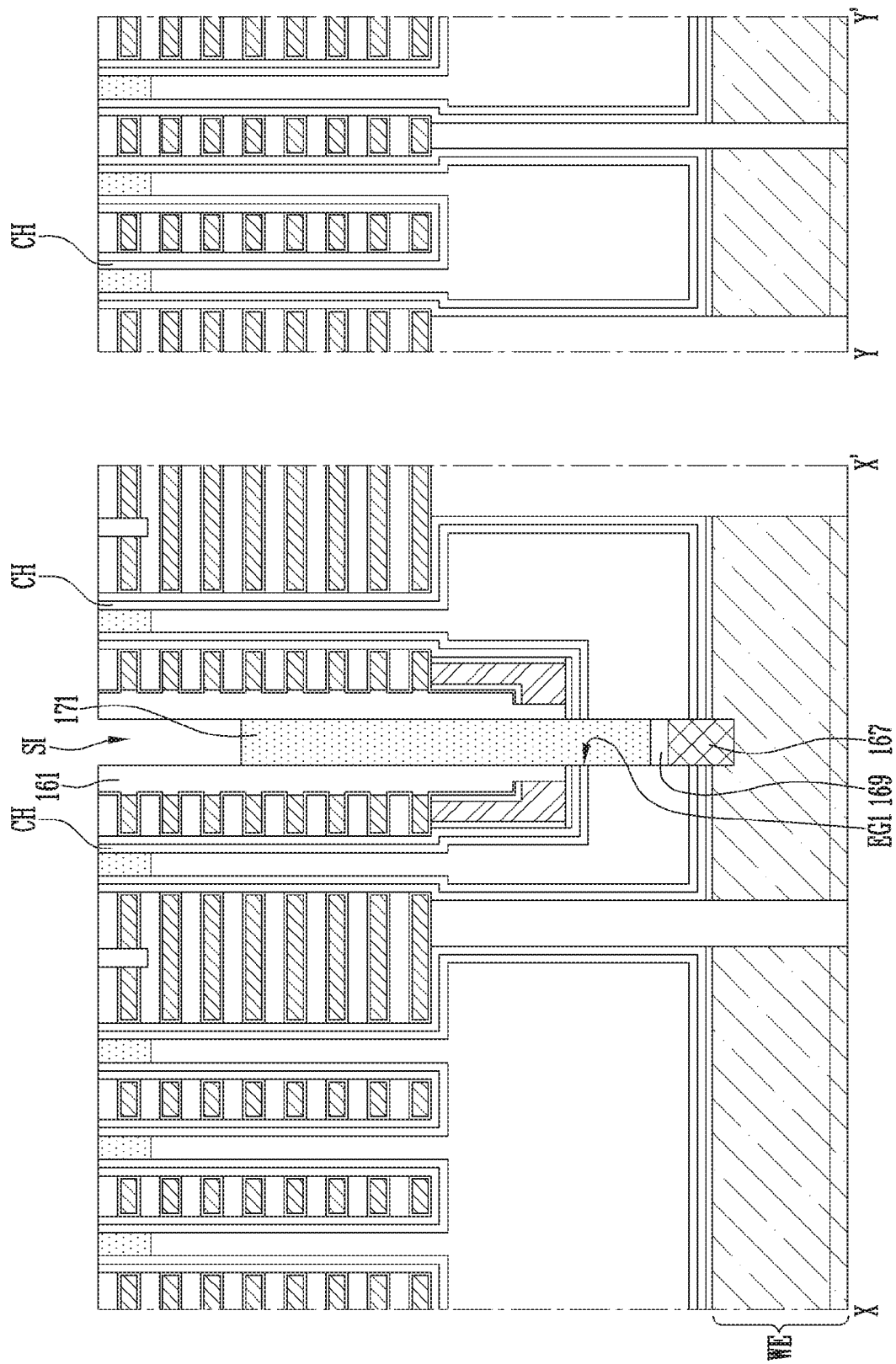
Figure 10H:
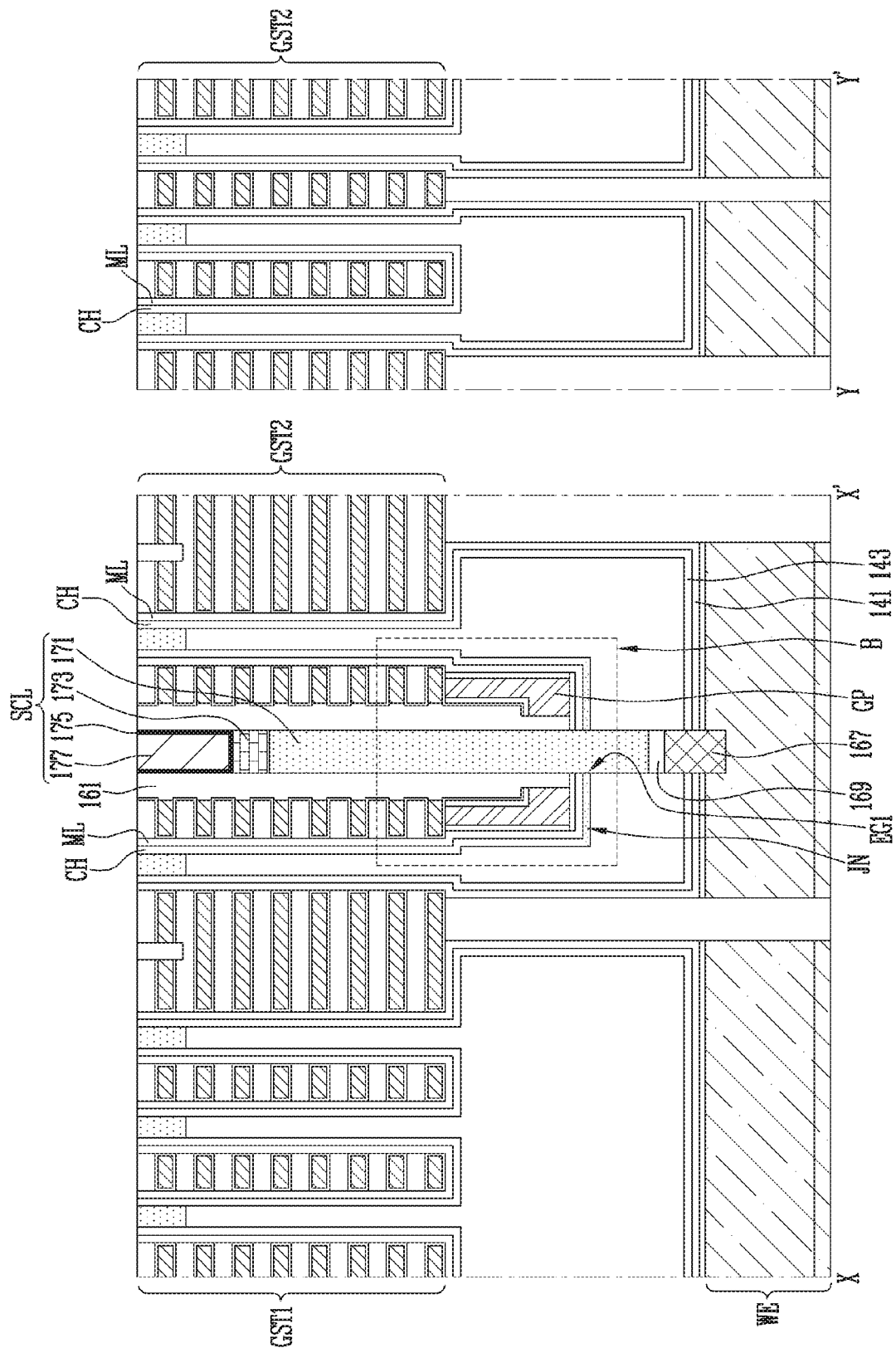

The source contact line SCL may include a plurality of conductive layers as shown in FIG. 10H. The source contact line SCL may include a metal layer 177 to have a low resistance. For example, the metal layer 177 may include tungsten. In order to prevent diffusion of metals from the metal layer 177, the source contact line SCL may further include a barrier metal layer 175 that extends along an interface between the metal layer 177 and the spacer insulating layers 161. As will be described later with reference to FIG. 10H, the barrier metal layer 175 may extend along a bottom surface of the metal layer 177.

FIGS. 10A to 10H are sectional views illustrating in detail the steps ST13 to ST19 shown in FIG. 3. FIGS. 10A to 10H are sectional views taken along lines X-X' and Y-Y' shown in FIG. 9.

Referring to FIG. 10A, before the step ST13 is performed, a spacer insulating layer 161 may be formed, which extends on the sidewall of the first through part TH1 and on the sidewall of the slit SI. The step of forming the spacer insulating layer 161 may include a step of depositing an insulating layer along a surface of the slit SI and a surface of the first through part TH1 and a step of etching the insulating layer through an etch-back process. While the insulating layer is being etched, the second protective layer and the multi-layered memory layer ML, which are exposed through the bottom surface of the first through part TH1, may be etched, and the channel layer 143 may be exposed. Accordingly, a second through part TH2 is formed, which separates the second protective layer into the second protective patterns 113P and exposes the channel layer 143 therethrough. Like the first through part TH1 and the slit SI, the second through part TH2 extends along the third direction III.

Referring to FIG. 10B, the step ST13 may include a step of forming a third through part TH3 that exposes the gap-fill insulating layer 145 therethrough by etching a portion of the channel layer 143 exposed through the second through part TH2. The third through part TH3 may extend to the inside of the gap-fill insulating layer 145. Like the second through part TH2, the first through part TH1, and the slit SI, the third through part TH3 extends along the third direction III.

The second through part TH2 and the third through part TH3 may constitute an upper through part of a trench. A first end part EG1 may be defined as a portion of the channel layer 143 adjacent to the gate pattern GP is cut by the upper through part including the second through part TH2 and the third through part TH3.

Referring to FIG. 10C, the step ST13 may further include a step of forming a channel protective layer 163 that extends on a sidewall of the upper through part including the second and third through parts TH2 and TH3 and on a sidewall of the spacer insulating layer 161. The step of forming the channel protective layer 163 may include a step of depositing a nitride layer and a step of etching the nitride layer through an etch-back process such that the gap-fill insulating layer 145 is exposed through the third through part TH3. The channel protective layer 163 may be formed of another material layer having the etch rate different from the etch rate of an oxide layer, in addition to the nitride layer.

The step ST13 may include a step of forming a fourth through part TH4 that exposes the well structure WE therethrough by etching the gap-fill insulating layer 145, the channel layer 143, the multi-layered memory layer 141, and the first protective layer 105, which are exposed under the third through part TH3. The fourth through part TH4 may constitute a lower through part of the trench. Like the third through part TH3, the second through part TH2, the first through part TH1, and the slit SI, the fourth through part TH4 extends along the third direction III.

A second end part EG2 may be defined as a portion of the channel layer 143 adjacent to well structure WE is cut by the fourth through part TH4. The fourth through part TH4 may extend into the well structure WE.

The trench including the second to fourth through parts TH2 to TH4 may expose the well structure WE therethrough by penetrating the multi-layered memory layer 141, the channel layer 143, and the gap-fill insulating layer 145, which are exposed between the gate patterns GP. Through the trench, the multi-layered memory layer 141 may be separated into multi-layered memory patterns ML, the channel layer 143 may be separated into channel patterns CH, and the gap-fill insulating layer 145 may be separated into gap-fill insulating patterns FI. The multi-layered memory patterns ML remain in a state in which they are respectively coupled to the stack structures GST1 and GST2 separated by the slit SI. The channel patterns CH also remain in a state in which they are respectively coupled to the stack structures GST1 and GST2. The gap-fill insulating patterns FI also remain in a state in which they are respectively coupled to the stack structures GST1 and GST2.

After the step ST13, the step ST15 of forming the well contact lines may be performed.

Referring to FIG. 10D, the step ST15 may include a step of forming a semiconductor layer that is in direct contact with the well structure WE and the second end part EG2 of each of the channel patterns CH. The step of forming the semiconductor layer may include a step of growing a silicon layer from the well structure WE and the second end part EG2 of each of the channel patterns CH. Accordingly, a well contact line 167 is formed, which connects the well structure WE and the channel patterns CH.

The well contact line 167 may extend along the third direction III that is the extending direction of the slit SI. The well contact line 167 may be formed to completely fill in the fourth through part TH4 corresponding to the lower through part of the trench.

Since the first end part EG1 of each of the channel patterns CH is blocked by the channel protective layer 163 while the well contact line 167 is being grown, the well contact line 167 is not grown from the first end part EG1 of each of the channel patterns CH. The first conductivity type dopant in the well structure WE may be diffused into the well contact line 167.

Referring to FIG. 10E, the step ST17 of forming the inter-well source insulating layer may include forming inter-well-source insulating layer 169 by oxidizing an upper portion of the well contact line 167 through the slit SI. The inter-well-source insulating layer 169 extends along the third direction III to block the well contact line 167, and is formed on the well contact line 167.

Referring to FIG. 10F, the step ST19 of forming the source contact line may include removing the channel protective layer 163. Since the inter-well-source insulating layer 169 has an etching selection ratio different from that of the channel protective layer 163, the loss of the inter-well-source insulating layer 169 can be minimized while the channel protective layer 163 is being removed. As the channel protective layer 163 is removed, the spacer insulating layer 161 may be exposed. In addition, as the channel protective layer 163 is removed, the first end part EG1 of each of the channel patterns CH is exposed.

Referring to FIG. 10G, the step ST19 may include forming a doped silicon layer 171 including a second conductivity type dopant on the inter-well-source insulating layer 169. The doped silicon layer 171 is in direct contact with the first end part EG1 of each of the channel patterns CH, and extends on the sidewall of the spacer insulating layer 161 in the slit SI. The doped silicon layer 171 may be formed with a height lower than that of the slit SI.

The second conductivity type dopant may have a conductivity type opposite to that of the first conductivity type dopant. For example, the second conductivity type dopant may be an n-type dopant, and the first conductivity type dopant may be a p-type dopant.

The doped silicon layer 171 may be used as a source contact line. The doped silicon layer 171 may be structurally isolated from the well contact line 167 by the inter-well-source insulating layer 169.

Referring to FIG. 10H, in the step ST19, a partial upper portion of the doped silicon layer 171 may be silicided through a silicidation process to be changed into a metal silicide layer 173. Since the metal silicide layer 173 has a resistance lower than that of the doped silicon layer 171, the resistance of the source contact line SCL can be lowered.

The silicidation process may include a process of depositing a metal layer and an annealing process of inducing a reaction between the metal layer and the doped silicon layer 171. The second conductivity type dopant in the doped silicon layer 171 may be diffused into each of the channel patterns CH by the annealing process performed while the silicidation process is being performed. Accordingly, a source junction JN is formed in each of the channel patterns CH. The source junction JN may be formed inside each of the channel patterns CH along the bottom surface of the gate pattern GP.

The gate pattern GP remains to be available for a source select line. Although it is difficult to uniformly control the diffusion range of the second conductivity type dopant, the distance between the remaining gate pattern GP and the source junction JN is short, and accordingly, the turn-on current of a source select transistor can be increased. That is, the turn-on current of the source select transistor can be stably ensured through the remaining gate pattern GP.

Various metal layers including nickel, tungsten, and the like may be used as the metal layer for the silicidation process. The metal silicide layer 173 formed through the silicidation process may be nickel silicide, tungsten silicide, or the like.

The step ST19 may further include a step of forming a metal layer 177 on the metal silicide layer 173. Before the metal layer 177 is formed, a barrier metal layer 175 may be further formed along surfaces of the spacer insulating layer 161 and the metal silicide layer 173.

The metal layer 177 may include tungsten and the like, and the barrier metal layer 175 may include a titanium nitride layer, a tungsten nitride layer, a tantalum nitride layer, and the like.

Through the above-described process, the source contact line SCL may be formed, which includes the doped silicon layer 171, the metal silicide layer 173, the barrier metal layer 175, and the metal layer 177. The source contact line SCL includes a second conductivity type dopant, and is in contact with the first end part EG1 of each of the channel patterns CH1 above the well contact line 167. The source contact line SCL and the well contact line 167 are spaced apart from each other by the inter-well-source insulating layer 169. Accordingly, the leakage current between the source junction JN and the well structure WE can be decreased.

According to the above-described processes, the multi-layered memory layer 141 and the channel layer 143 extend to a space between the well structure WE and the stack structures GST1 and GST2 from portions penetrating the stack structures GST1 and GST2, and is penetrated by the source contact line SCL and the well contact line 167.

Figure 11:
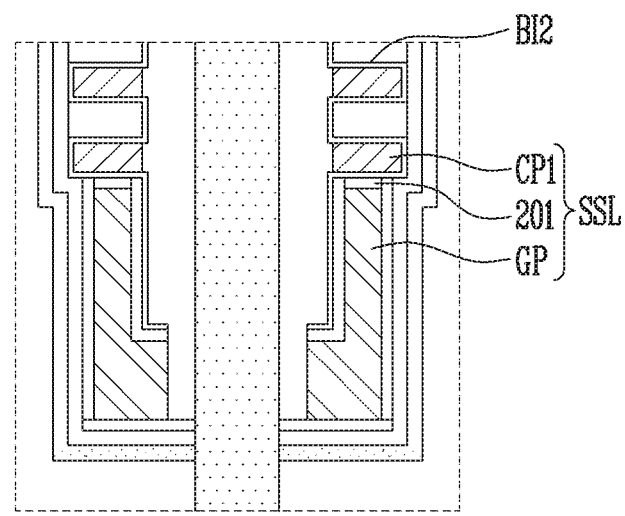
FIG. 11 is a sectional view illustrating a structure of a source select transistor according to an embodiment of the present disclosure.

FIG. 11 is a sectional view illustrating a structure of a source select transistor according to an embodiment of the present disclosure. More specifically, FIG. 11 is a sectional view illustrating another embodiment of region B shown in FIG. 10H.

The source select transistor shown in FIG. 11 may further include an oxide layer 201 as compared with the source select transistor shown in FIG. 1 or 10H. The oxide layer 201 is disposed between a gate pattern GP used as a source select line SSL and a first horizontal conductive pattern CP1 used as the source select line SSL. The first horizontal conductive pattern CP1 may be formed on a second blocking insulating layer BI2. The oxide layer 201 extends along an interface between the second block insulating layer BI2 and the gate pattern GP.

In the embodiment of the present disclosure, a first conductive layer that is disposed under a stack structure and serves as an etch stop layer during a slit forming process overlaps with a portion of the stack structure instead of the entire stack structure. Accordingly, in the embodiment of the present disclosure, it is possible to prevent a phenomenon that the resistance of the source select line disposed as the lowermost layer of the stack structure is increased due to the first conductive layer.

In the embodiment of the present disclosure, the first conductive layer that serves as an etch stop layer remains as the gate pattern to overlap with one side of the stack structure, so that the turn-on current of the source select transistor defined in the lowermost layer of the stack structure can be increased.

In the embodiment of the present disclosure, the resistance of the source select line is lowered, and the turn-on current of the source select transistor is increased, thereby improving the operational reliability of the semiconductor device.

Figure 12:
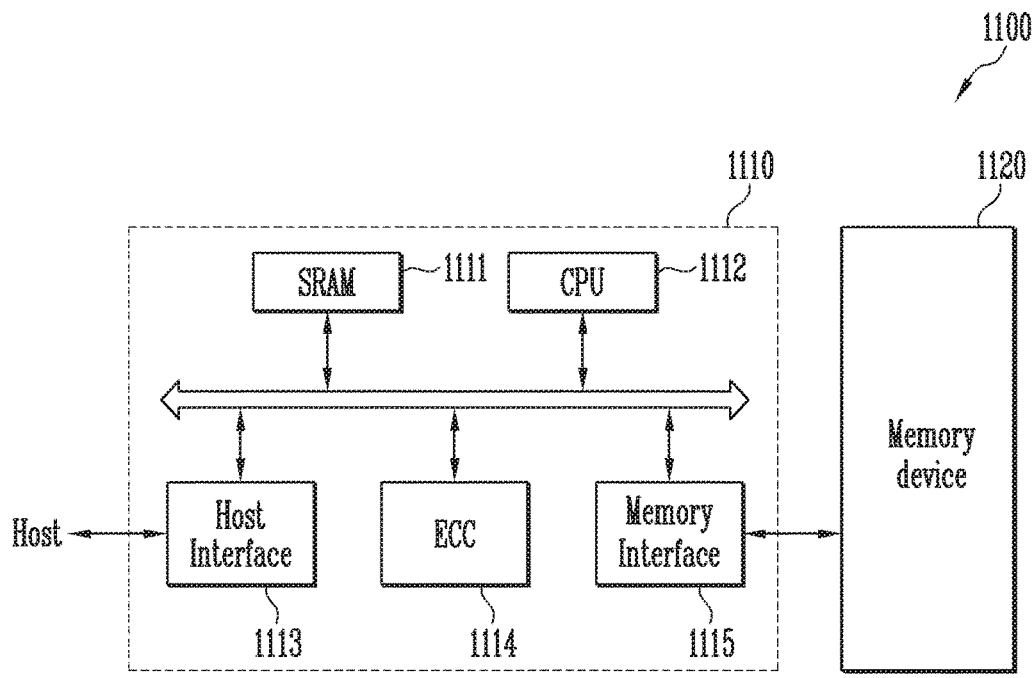
FIG. 12 is a block diagram illustrating a configuration of a memory system according to an embodiment of the present disclosure.

FIG. 12 is a block diagram illustrating a configuration of a memory system according to an embodiment of the present disclosure.

Referring to FIG. 12, the memory system 1100 according to the embodiment of the present disclosure includes a memory device 1120 and a memory controller 1110.

The memory device 1120 may include the structure described in FIGS. 1, 2A, 2B, 10H, and 11. The memory device 1120 may be a multi-chip package formed of a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs a general control operation for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a solid state disk (SSD), in which the memory device 1120 is combined with the memory controller 1110. For example, when the memory system 1100 is an SSD, the memory controller 1110 may communicated with the outside (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 13:
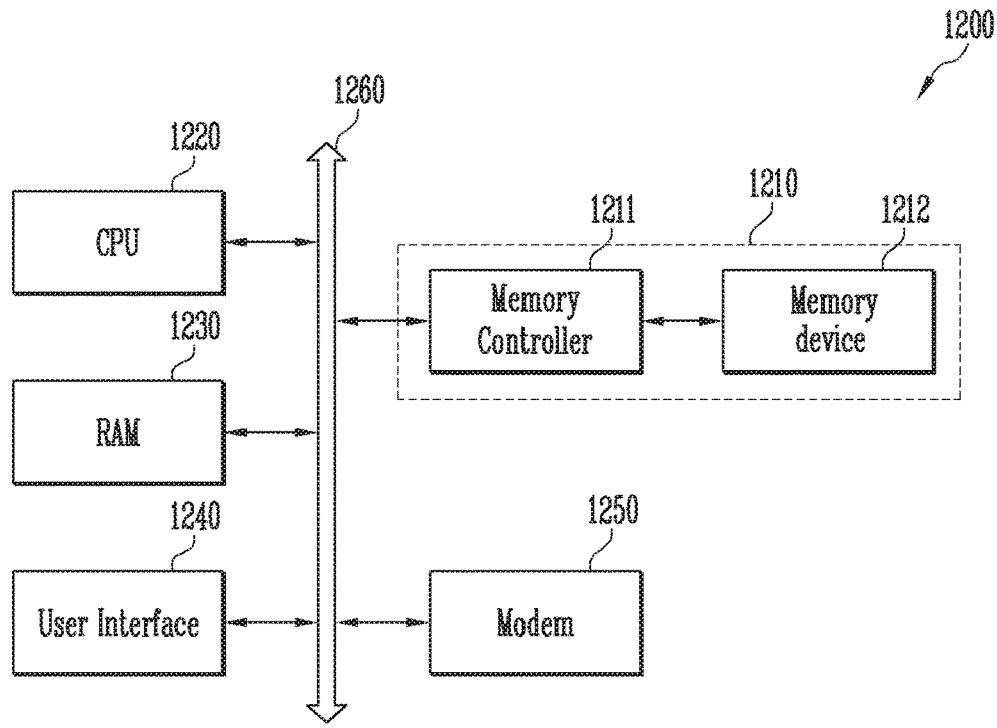
FIG. 13 is a block diagram illustrating a computing system according to an embodiment of the present disclosure.

FIG. 13 is a block diagram illustrating a computing system according to an embodiment of the present disclosure.

Referring to FIG. 13, the computing system 1200 according to the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 12, may be configured with a memory device 1212 and a memory controller 1211.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:
   forming a sacrificial group having a buried pattern embedded therein;
   forming a stack structure over the sacrificial group, wherein the stack structure includes first material layers and second material layers, which are alternately stacked, wherein the stack structure is divided into a first region overlapping with the buried pattern and a second region extending from the first region, and wherein the second region of the stack structure does not overlap with the buried pattern;
   forming a hole penetrating the second region of the stack structure to expose the sacrificial group;
   removing the sacrificial group;
   forming a multi-layered memory layer and a channel layer within the hole, wherein the multi-layered memory layer and the channel layer extend along a sidewall of the buried pattern and a bottom surface of the buried pattern;
   forming a slit exposing a sidewall of the stack structure therethrough by etching the first region of the stack structure through an etching process that is stopped when the buried pattern is exposed; and
   separating the buried pattern into gate patterns by etching a portion of the buried pattern exposed through the slit.

2. The method of claim 1, wherein a width of the slit is narrower than that of the buried pattern.

3. The method of claim 1, wherein the buried pattern is formed of a material different from that of the first material layers and the second material layers.

4. The method of claim 1, wherein the separating of the buried pattern into the gate patterns includes forming a first through part that completely penetrates the buried pattern exposed through the slit.

5. The method of claim 4, comprising:
   forming a protective layer by oxidizing a surface of the buried pattern exposed through the slit;
   replacing the first material layers with third material layers through the slit; and
   forming a spacer insulating layer extending along a sidewall of the first through part from a sidewall of the slit.

6. A method of manufacturing a semiconductor device, the method comprising:
   forming a sacrificial group having a buried pattern embedded therein;
   forming a stack structure over the sacrificial group, wherein the stack structure includes first material layers and second material layers, which are alternately stacked, wherein the stack structure is divided into a first region overlapping with the buried pattern and a second region extending from the first region, and wherein the second region of the stack structure does not overlap with the buried pattern;
   forming a slit exposing a sidewall of the stack structure therethrough by etching the first region of the stack structure through an etching process that is stopped when the buried pattern is exposed; and separating the buried pattern into gate patterns by etching a portion of the buried pattern exposed through the slit, wherein the forming of the sacrificial group having the buried pattern embedded therein includes:

forming a first protective layer on a well structure;

forming a first sacrificial layer on the first protective layer;

forming a second protective layer on the first sacrificial layer;

forming a conductive layer on the second protective layer;

forming supporting poles penetrating the well structure from the conductive layer;

forming a first opening and the buried pattern by etching the conductive layer, the first opening exposing the supporting poles;

forming a third protective layer by oxidizing a surface of the buried pattern;

etching the third protective layer and the second protective layer through an etch-back process such that the third protective layer remains on a sidewall of the buried pattern, the second protective layer remains under the buried pattern, and the first sacrificial layer is exposed; and filling a second sacrificial layer in the first opening.

7. The method of claim 6, comprising:

forming holes that expose the second sacrificial layer therethrough by penetrating the second region of the stack structure;

forming a second opening that exposes the first sacrificial layer and the third protective layer therethrough and is connected to the holes by removing the second sacrificial layer through the holes;

forming a third opening that opens a space between the buried pattern and the well structure by removing the first sacrificial layer;

forming a multi-layered memory layer that extends to the inside of the holes from the inside of a horizontal space including the second and third openings along a surface of the horizontal space and surfaces of the holes;

forming a channel layer on a surface of the multi-layered memory layer; and forming a gap-fill insulating layer filled in the horizontal space and the holes on the channel layer.

8. The method of claim 7, further comprising forming a trench that penetrates the multi-layered memory layer, the channel layer, and the gap-fill insulating layer, which are exposed between the gate patterns, wherein the multi-layered memory layer is separated into multi-layered memory patterns by the trench, the channel layer is separated into channel patterns by the trench, and the gap-fill insulating layer is separated into gap-fill insulating patterns by the trench.

9. The method of claim 8, wherein the forming of the trench includes:

forming an upper through part that extends to the inside of the gap-fill insulating layer by penetrating the multi-layered memory layer and the channel layer, which are exposed between the gate patterns, and defines a first end part of the channel pattern; and forming a lower through part that exposes the well structure therethrough and defines a second end part of the channel pattern by removing portions of the gap-fill insulating layer and the channel layer under the gap-fill insulating layer through the upper though part.

10. The method of claim 9, further comprising:

forming a well contact line inside the lower through part to be in contact with the second end part of the channel pattern and the well structure;

forming an inter-well-source insulating layer on the well contact line; and forming a source contact line in contact with the first end part of the channel pattern on the inter-well-source insulating layer.

11. The method of claim 10, further comprising:

before the forming of the lower through part, forming a channel protective layer protecting the first end part of the channel pattern on a sidewall of the upper through part; and after the forming of the inter-well-source insulating layer, removing the channel protective layer.

12. The method of claim 10, wherein the well structure includes a first conductivity type dopant, and the source contact line includes a second conductivity type dopant different from the first conductivity type dopant.

13. The method of claim 12, further comprising forming a source junction inside the channel pattern by diffusing the second conductivity type dopant in the source contact line into the channel pattern adjacent to the source contact line.

14. A method of manufacturing a semiconductor device, the method comprising:

forming a well structure including a first conductivity type dopant;

forming a sacrificial group over the well structure, wherein the sacrificial group has a conductive pattern embedded therein;

forming a stack structure over the sacrificial group, wherein the stack structure includes a first region overlapping with the conductive pattern and a second region extending from the first region;

forming holes that penetrate the second region of the stack structure;

opening a horizontal space by removing the sacrificial group through the holes;

forming a multi-layered memory layer extending to the inside of the holes from the inside of the horizontal space along a surface of the horizontal space and surfaces of the holes;

forming a channel layer on a surface of the multi-layered memory layer;

forming a gap-fill insulating layer that is filled in the horizontal space and the holes on the channel layer;

exposing the well structure by etching the first region of the stack structure, the conductive pattern, the multi-layered memory layer, the gap-fill insulating layer, and the channel layer;

forming a well contact line that connects the well structure and the channel layer; and forming a source contact line that is connected to the channel layer on the top of the well contact line and includes a second conductivity type dopant.

15. The method of claim 14, wherein the exposing of the well structure includes:

forming a slit that exposes a side wall of the stack structure and the conductive pattern therethrough by etching the first region of the stack structure;

forming a first through part that separates the conductive pattern into gate patterns by etching the conductive pattern exposed through the slit;

forming a second through part that exposes the channel layer therethrough by etching the multi-layered memory layer exposed through the first through part;

forming a third through part that exposes the gap-fill insulating layer therethrough by etching the channel layer exposed through the second through part; and forming a fourth through part that extends toward the well structure from the third through part to penetrate the gap-fill insulating layer, the channel layer, and the multi-layered memory layer under the third through part and exposes the well structure therethrough.

16. The method of claim 14, wherein the channel layer is separated into channel patterns in the exposing of the well structure, and each of the channel patterns includes a first end part adjacent to the conductive pattern and a second end part adjacent to the well structure.

17. The method of claim 16, wherein the well contact line connects the second end part of the channel pattern and the well structure, and the source contact line is connected to the first end part of the channel pattern.

18. The method of claim 14, further comprising, before the forming of the source contact line, forming an inter-well-source insulating layer by oxidizing an upper portion of the well contact line.

19. The method of claim 14, wherein the forming of the source contact line includes:

forming a silicon layer including the second conductivity type dopant;

changing a top end of the silicon layer into a metal silicide layer by using a silicidation process; and forming a metal layer on the metal silicide layer.

20. The method of claim 19, wherein a source junction is formed inside the channel layer as the second conductivity type dopant in the silicon layer is diffused into the channel layer during the silicidation process.

* * * * *